(12) United States Patent
Inoue et al.

(10) Patent No.: US 7,608,844 B2
(45) Date of Patent: Oct. 27, 2009

(54) CHARGED PARTICLE BEAM DRAWING APPARATUS

(75) Inventors: Yuji Inoue, Hitachinaka (JP); Haruo Yoda, Hinode-machi (JP); Kimiaki Ando, Hamura (JP); Yoshikiyo Yui, Utsunomiya (JP)

(73) Assignees: Hitachi High-Technologies Corporation, Tokyo (JP); Canon Inc., Tokyo (JP)

( * ) Notice: Subject to any disclaimer, the term of this patent is extended or adjusted under 35 U.S.C. 154(b) by 0 days.

(21) Appl. No.: 11/136,703

(22) Filed: May 25, 2005

(65) Prior Publication Data

US 2005/0285054 A1    Dec. 29, 2005

(30) Foreign Application Priority Data

May 26, 2004 (JP) ............................. 2004-156176

(51) Int. Cl.
*G21K 5/10* (2006.01)

(52) U.S. Cl. .................... 250/492.22; 250/310; 345/443

(58) Field of Classification Search ............ 250/492.22, 250/492.2
See application file for complete search history.

(56) References Cited

U.S. PATENT DOCUMENTS

| | | | | |
|---|---|---|---|---|
| 4,820,928 A | * | 4/1989 | Ooyama et al. | 250/492.2 |
| 4,837,447 A | * | 6/1989 | Pierce et al. | 250/492.2 |
| 4,882,683 A | * | 11/1989 | Rupp et al. | 345/568 |
| 5,533,170 A | | 7/1996 | Teitzel et al. | |
| 5,600,734 A | * | 2/1997 | Okubo et al. | 382/147 |
| 5,689,255 A | * | 11/1997 | Frazier et al. | 341/63 |
| 5,812,412 A | * | 9/1998 | Moriizumi et al. | 716/21 |
| 6,717,097 B1 | * | 4/2004 | Sandstrom et al. | 219/121.6 |
| 2004/0119029 A1 | | 6/2004 | Nagata et al. | |
| 2004/0143356 A1 | | 7/2004 | Yoda et al. | |

FOREIGN PATENT DOCUMENTS

| | | |
|---|---|---|
| JP | 60-198723 | 10/1985 |
| JP | 03-189874 | 8/1991 |
| JP | 04-286314 | 10/1992 |
| JP | 8-505003 | 5/1996 |
| JP | 2004-63870 | 2/2004 |
| JP | 2004-200351 | 7/2004 |
| WO | WO 94/10633 A | 5/1994 |

\* cited by examiner

*Primary Examiner*—David A. Vanore
*Assistant Examiner*—Phillip A. Johnston
(74) *Attorney, Agent, or Firm*—Antonelli, Terry, Stout & Kraus, LLP.

(57) ABSTRACT

In the present invention, vector data developing unit, ends separating unit, overlap removing unit and bitmapped data generating unit are sequentially connected in order to make pipeline processing. In addition, data of each raster is orderly arranged as a unit so that each processor can process data of each raster at a time. Each processor can make the pipeline processing to fast generate data. In addition, small-scale circuits can be used to realize the system because each raster can be processed as a unit of processing. Moreover, since data is orderly arranged before being processed, multi-valued bitmapped data can be generated in the order of drawing. Therefore, the drawing operation and data generating operation can be performed in parallel without use of any large-scale storage device.

21 Claims, 28 Drawing Sheets

| ATTRIBUTE | START-POINT | LENGTH | ADDITIONAL DATA | 601 |

FIG. 31

| REPETITION-COMPRESSED UPPER (LOWER) SIDE SEGMENT | START-POINT (x,y) | LENGTH Δx | REPETITION PITCH dx | REPETITION PITCH dy | REPETITION NUMBER OF TIMES Nx | REPETITION NUMBER OF TIMES Ny |

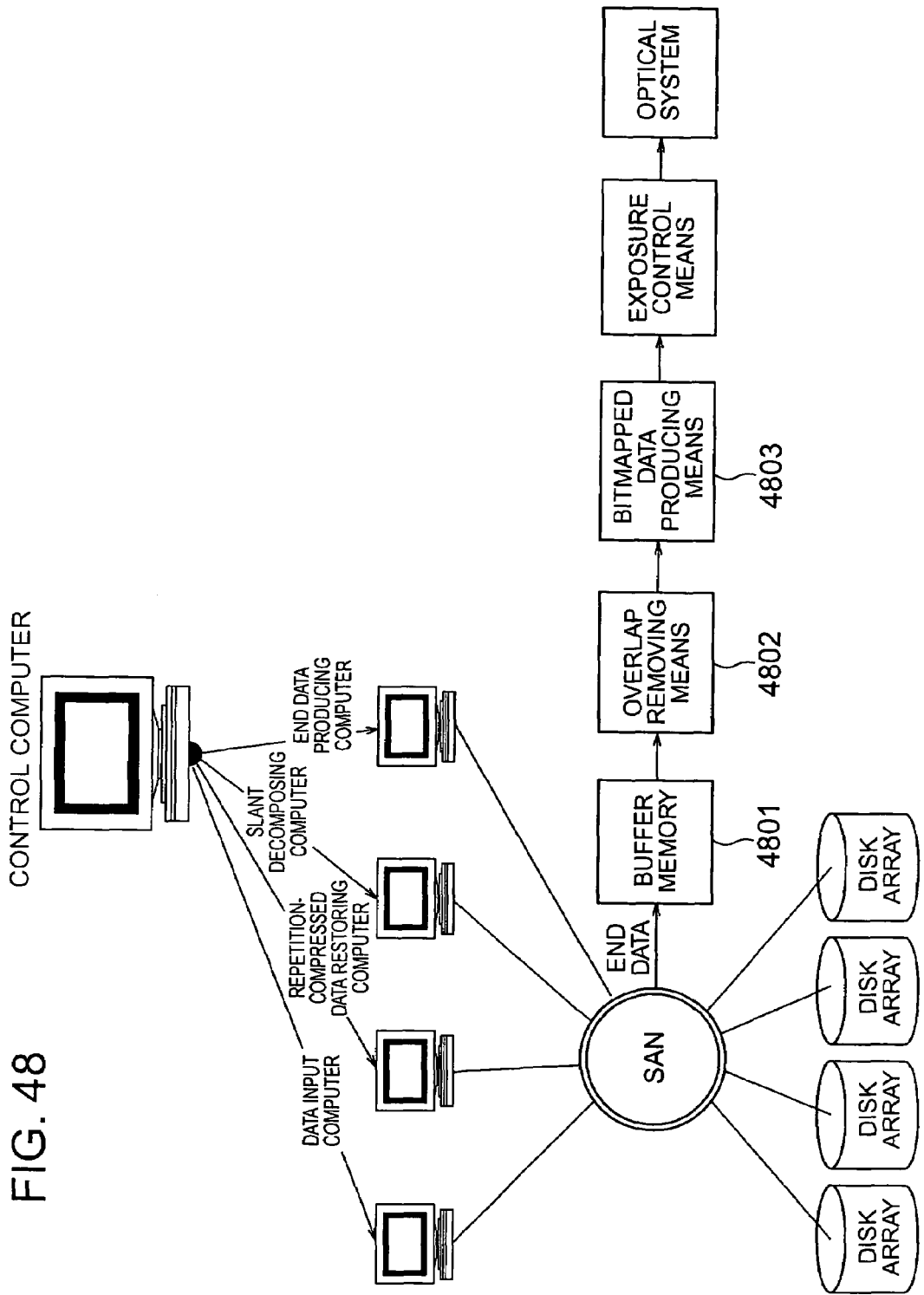

CHARGED PARTICLE BEAM DRAWING APPARATUS

BACKGROUND OF THE INVENTION

The present invention generally relates to charged particle beam drawing apparatus for drawing by irradiating an electron beam or ion beam on a sample, and particularly to a charged particle beam drawing apparatus for drawing by using bitmapped pattern data during the raster scanning of a charged beam.

The charged particle beam drawing apparatus includes, for example, electron beam apparatus and focused-ion beam apparatus. These apparatus deflect the charged particle beam with high precision and irradiate it on the object being processed to thereby finely work upon the object. These apparatus are widely used chiefly for manufacturing semiconductor devices.

Here, an example will be mentioned of producing an integrated circuit pattern on a semiconductor sample by using an electron beam apparatus. The semiconductor sample is coated with a substance called resist that is sensitive to the electron beam. The electron beam apparatus irradiates the electron beam on the resist while referring to the designed integrated circuit pattern to draw the integrated circuit pattern on the resist. The raster scanning type electron beam apparatus deflects the shapely focused spot beam to make raster scanning, and controls the beam to turn on and off in accordance with the integrated circuit pattern, thus drawing.

In the raster scanning system, in order to control the spot beam to turn on and off, draw data (data representative of on and off) is generated from the integrated circuit pattern, and used to control the spot beam. In general, the draw data can be expressed by bitmapped image data.

The integrated circuit pattern is converted from the designed data (CAD format) to intermediate data suited to process by the drawing apparatus, and stored in a storage device. At the time of drawing, the intermediate data is converted to the bitmapped data. This process mentioned above is performed on a PC (personal computer) or WS (work station). If the designed data is tried to develop into bitmapped data by using WS or the like, vast amounts of processing time and huge volumes of data will be necessary.

As a prior art for converting from the designed data to the bitmapped data, there is a bitmapped data producing method to be used in the raster scanning type electron beam apparatus that is disclosed in, for example, JP-A-8-505003.

The conventional method will be described with reference to FIG. 2.

Referring to FIG. 2, an apparatus to carry out this method includes a computer 201 into which CAD format data is inputted, pre-processing means 202 for generating intermediate data from CAD data, bitmapped data generating means 203 for generating bitmapped data, a storage device 204 for storing the bitmapped data, and an optical system 205 for drawing by referring to the bitmapped data stored in the storage device. This method will be described with reference to, for example, the pattern shown in FIG. 3. A circuit layout pattern representative of a polygon is divided into partial figures such as oblong rectangles and trapezoids, and then processed. Since the pattern is the collection of simple figures as illustrated in FIG. 3, it is not divided, but oblong rectangles 302, 303 and a trapezoid 301 are defined as partial figure data. These figures are expressed by information of their type, start-point, end-point, length and angle. These intermediate data are converted to bitmapped image data. FIG. 4 is a magnified view of a region 304 shown in FIG. 3. A region 402 is a pixel. A technique such as DDA (Digital Differential Analyzer) is used to compute the intersections of figures and each raster, thus determining boundaries of figures in each raster. The figure in each raster is marked out according to the computed boundaries of figures. This operation is repeated for all rasters. FIG. 5 is a magnified view of a region 401 of 64 pixels shown in FIG. 4. The partial figure data is converted to bitmapped image data of binary values of on (1) and off (0) as shown in FIG. 5. The bitmapped partial figure data are sequentially stored in a high-speed memory that has two-dimensional addresses corresponding to the actually depictive region. In this case, the pieces of data written in the same address are logically summed so that figures are prevented from being overlapped. In this way, the bitmapped data are produced over the entire depicted regions.

The procedure for drawing is performed such that the image data of a depicted unit region is produced and then the bitmapped data are sequentially read according to the scanning direction to draw.

In the electron beam apparatus as described above, the intermediate data is previously produced and held in the storage device, and when drawing is made, the bitmapped data for the necessary region is generated with high speed. That region is drawn by referring to the produced bitmapped data.

SUMMARY OF THE INVENTION

Recently, the precision demanded to the drawing apparatus has been exponentially increased as the semiconductor devices progress to the finer patters. In order to precisely represent fine patterns, it is necessary to increase the number of pixels per unit region, and to increase the amount of data to be processed because of the finer patterns. In addition, the drawing time is increased because of the increased number of pixels.

Thus, in order to increase the drawing speed, the recent electron beam apparatus uses thickness values, not binary values for the pixels of the bitmapped data and draws with the exposure intensity proportional to the thickness value. If the value of each pixel is converted to the thickness value, the pattern position and size can be adjusted at a finer pitch than that of the boundary between pixels, and thus the pattern can be drawn with less number of pixels and with high precision.

In this case, in order to remove the overlaps between the pattern data and to produce thickness bitmapped data, it is first necessary that the pixel region should be divided into finer small pixel regions. Then, after the binary bitmapped data is once produced for each small pixel unit, the sum of the small pixel units of ON (1) are required to compute and to produce the thickness value of the pixel. If each pixel is expressed by a thickness value of, for example, 256 levels, each pixel must be divided into 256 very small pixels, and those small pixels are required to convert to binary bitmapped data. Then, it is necessary to count the number of the small pixels of ON (1). Therefore, it takes tremendous amount of processing time to produce multi-valued bitmapped data. As a result, when much data is processed, the processing time for data is longer than the drawing time, and hence the overall drawing efficiency (throughput) of the apparatus is not always satisfactory.

The first challenge of this invention tries is to put the fast processing for producing multi-valued bitmapped data into practice.

In addition, the semiconductor patterns to draw has become increasingly finer in recent years, and the amount of thickness bitmapped data necessary for drawing fine patterns is said to have reached a few terabytes of data. The system in which this amount of data is all stored in the storage device would become large-scale, and thus it is impractical.

Thus, the second challenge of the invention is to miniaturize the storage device for storing the bitmapped data and the processor circuits.

A good measure for the first challenge is to provide two storage devices for the bitmapped data so that, while one of the two storage devices is being used to read out during the drawing operation, the other produces the data. However, large-scale storage devices would be necessary, and hence it would be impossible to achieve the miniaturization of the device size as the second challenge.

The conventional system has the problems that it needs tremendous amounts of time and must use an enormous storage capacity for storing the bitmapped data resulting from the processing of data. Therefore, it is difficult to achieve the improvement in the processing speed and the miniaturization of processor circuits.

In view of the above problems, it is an objective of the invention to provide a charged particle beam drawing apparatus capable of fast producing and reading the bitmapped data without increasing the scale of the storage devices to be used.

According to the invention, there is provided a charged particle beam drawing apparatus having vector data developing means that converts designed data of polygons expressed in segment vectors to data of segment vectors, ends-separating means that separates two data of start-point and end-point from the segment data of the converted segment vector data, and bitmap generating means that generates bitmapped data from this end data.

Thus, the data processing can be performed for each of the raster units that are repeated to scan for exposure irradiation, and hence fast processing can be made with fewer amounts of data.

According to the invention, the bitmapped data can fast be produced and read out without increasing the scale of the storage devices.

Other objects, features and advantages of the invention will become apparent from the following description of the embodiments of the invention taken in conjunction with the accompanying drawings.

BRIEF DESCRIPTION OF THE DRAWINGS

FIG. 31 is a diagram showing an example of the data structure processed in the two-dimensional repetition-compressed data restoring means in the embodiments of the invention.

FIG. 48 is a diagram showing an example of the case in which this invention is realized by using software and hardware in the embodiments of the invention.

DESCRIPTION OF THE EMBODIMENTS

Figure 1:
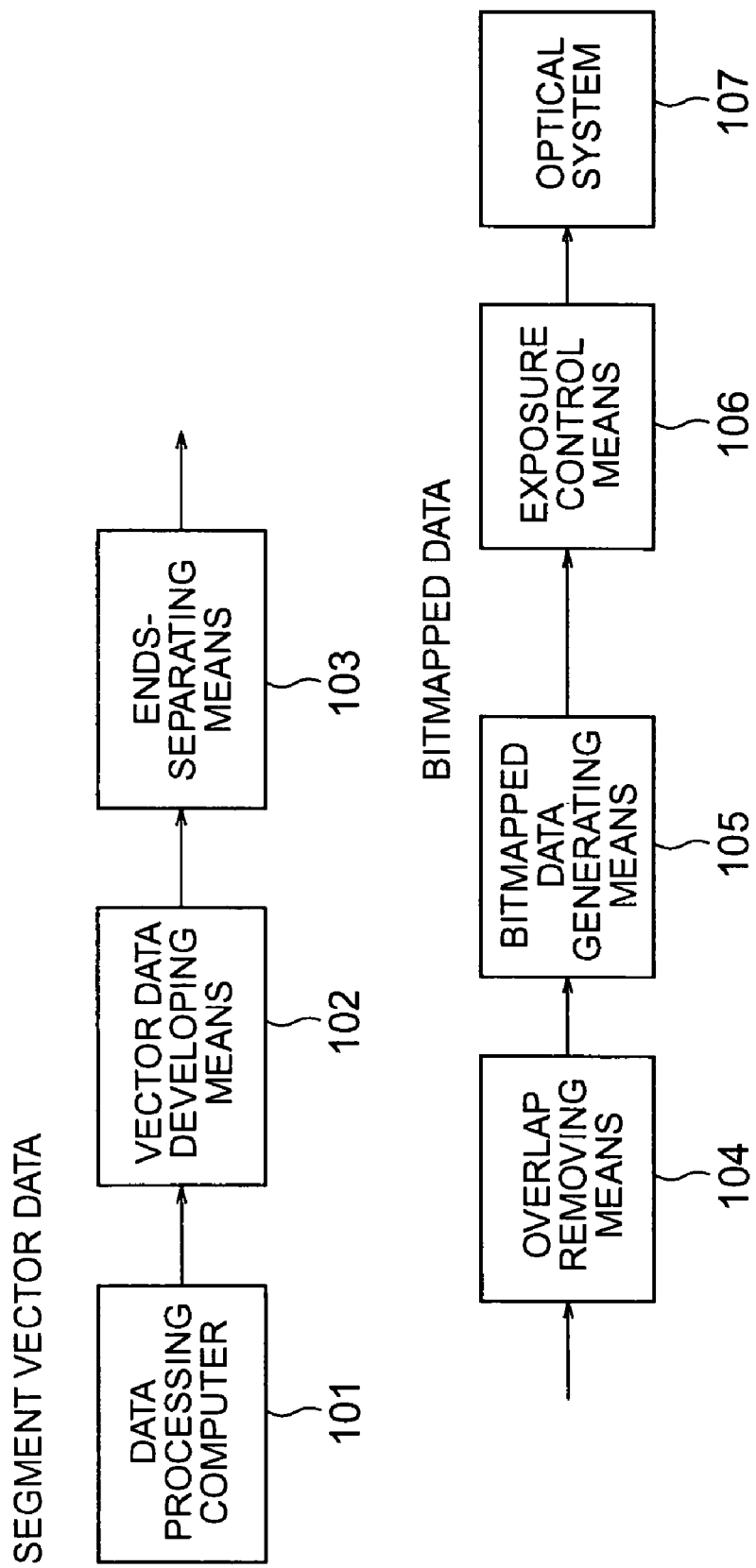
FIG. 1 is a block diagram showing the construction of an example of a charged particle beam drawing apparatus useful for explaining embodiments of the invention.
Figure 2:
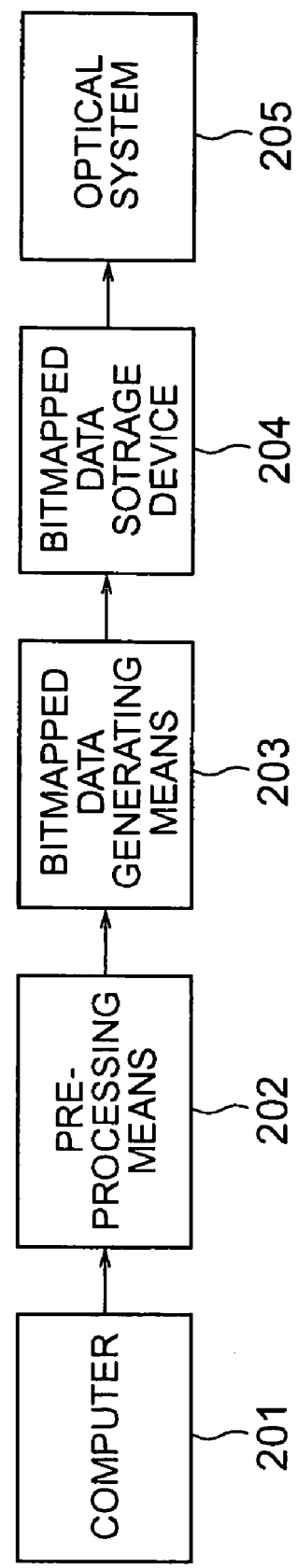
FIG. 2 is a block diagram showing the construction of a conventional charged particle beam drawing apparatus.
Figure 3:
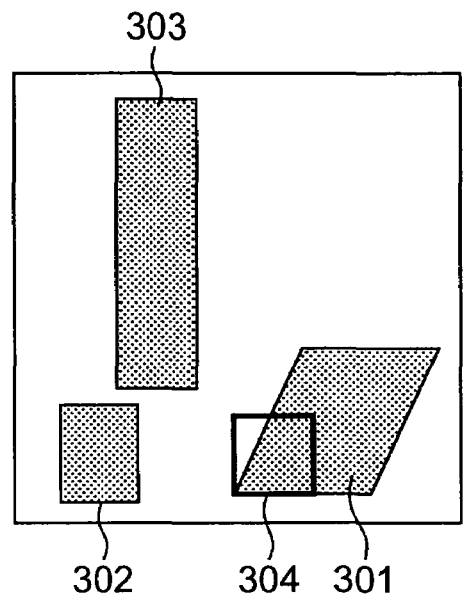
FIG. 3 is a diagram showing one example of a depicted pattern in the prior art.
Figure 4:
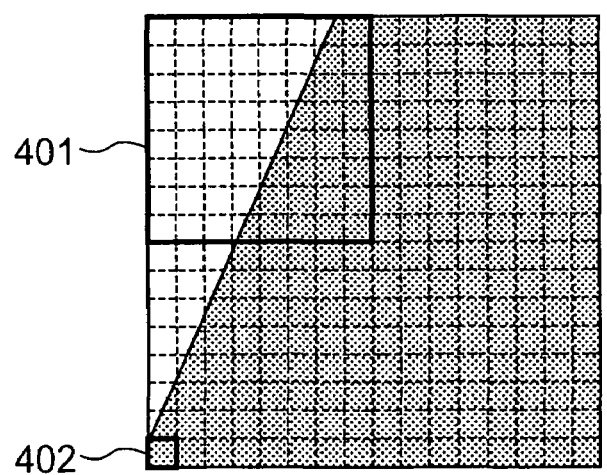
FIG. 4 is a magnified view of part of the pattern shown in FIG. 3.

The main features of this invention will be summarized before the description of embodiments of the invention.

According to the invention, there is provided a charged particle beam drawing apparatus having:

vector data developing means for converting designed data of figures expressed in segment vectors to segment vector data;

ends-producing means that processes the segment data of the produced segment vector data into two end data of start-point and end-point;

bitmapped-data generating means that generates bitmapped data from this end data;

exposure control means that controls the charged particle beam according to this bitmapped data; and an optical system that irradiates the charged particle beam controlled for exposure by this exposure control means.

Thus, data can be processed in raster units, and hence the amount of data to be treated at a time is small and can be quickly processed. Accordingly, there is no need to use a large-scale storage device, and thus each processor means (circuits) can be built up with small-scale circuits.

According to another aspect of the invention, there is provided a charged particle beam drawing apparatus having:

vector data developing means for converting pattern data of polygonal data expressed in segment vectors to groups of segment vector data that are parallel in the raster scanning direction (X-axis direction);

ends-producing means that produces start-points and end-points from segment vectors;

overlap removing means that removes an overlap of figures; and bitmapped data generating means that generates bitmapped data, the overlap removing means being placed before the bitmapped data generating means so that the overlap of figures can be removed before the bitmapped data is produced. Therefore, the processing required to make against the overlap of figures as in the prior art can be greatly simplified when the bitmapped data is generated.

In addition, since the pipeline processing can be performed by connecting the vector data developing means, the ends-producing means, the overlap removing means and the bitmapped data generating means, data can be fast processed.

Moreover, according to another aspect of the invention, there is provided a charged particle beam drawing apparatus having:

vector data developing means for converting pattern data of polygonal data expressed in segment vectors to groups of segment vector data parallel in the raster scanning direction (X-direction);

ends-producing means that produces start-points and end-points from segment vector;

overlap removing means that removes the overlap of figures; and bitmapped data generating means that generates the bitmapped data, wherein the input pattern data to the vector data developing means is expressed in polygonal vector data (segment vector data) and the segment vector data are arranged for each raster unit.

In addition, each of the vector data developing means, ends-producing means, overlap removing means, and bitmapped data generating means processes each raster unit of data at a time. Since each raster unit of data is processed at a time, each of the processor means can be miniaturized.

In addition, since the bitmapped data are generated in the order of smaller Y-axis coordinate, the drawing operation and drawing data generation can be performed for each raster unit. Therefore, a raster scanning type drawing apparatus can be achieved without any large-scale storage device required in the prior art.

The above vector data developing means has repetition-compressed data restoring means provided to receive input data of repetition-compressed segment data and restore it into the original segment data. In addition, the vector data developing means has slant decomposing means provided to develop slant vector data into a plurality of segments parallel in the raster scanning direction (X-direction).

Since the above slant decomposing means is provided, the slant vector data can be supplied directly to the vector data developing means. In addition, since data can be inputted as it is compressed, the amount of drawing data (segment data) fed from a host computer can be reduced, and thus a large-scale intermediate data storage device is not necessary. Thus, the circuits can be small-sized.

In addition, the above repetition-compressed data restoring means has:

output-data generating means provided to process repetition-compressed data in the order of smaller coordinate of raster-scanning direction (or smaller X-axis coordinate);

remaining-data processing means provided to redefine the remaining repetition-compressed vector data except the output data as repetition-compressed vector data;

temporarily-storing/arranging means provided to arrange the redefined repetition-compressed vector data in the order of smaller raster scanning direction (X-axis) coordinate, and store the arranged data; and comparing means provided to compare input data and the output data from the temporarily-storing/arranging means and supply the resulting output in the order of raster scanning direction (X-axis) coordinate to the output-data producing means and to the remaining-data processing means. Thus, with the above construction, vector data can be produced while the repetition-compressed data is being developed and arranged in the order of smaller raster scanning direction (X-axis) coordinate.

Moreover, the structure of data inputted to the repetition-compressed data restoring means has attribute data indicating the type of segment vector, segment data formed of start-points and end-points or start points and lengths of segment vectors, and repetition information data for use in the restoration processing. Thus, a plurality of pieces of data can be expressed, or restored by rewriting the segment data while the repetition information data and segment data are being referred to.

Since the repetition-compressed data restoring means has the above construction, and receives the above data structure, the input data can be sequentially processed while it is being arranged in the raster scanning direction (X-direction). In addition, since the arrangement condition can be kept, the pipeline processing can be made for each unit of segment vector data in the raster scanning direction, thus making it possible to increase the processing speed and miniaturize circuits.

Moreover, the above slant decomposing means has:

output-data generating means that processes slant vector data in the order of smaller X-axis coordinate;

remaining slant data generating means that redefines the remaining slant vector data as slant vector data;

intra-raster judging means that judges whether the redefined slant vector data is included in the current raster;

first temporarily-storing/arranging means that arranges intra-raster data in the order of smaller X-axis coordinate according to the result from the intra-raster judging means and stores the arranged data;

second temporarily-storing/arranging means that arranges extra-raster data in the order of smaller raster number (Y-axis direction) and smaller X-axis direction according to the result from the intra-raster judging means and stores the arranged data; and comparing means that compares the input data, the output data from the first temporarily-storing/arranging means and the output data from the second temporarily-storing/arranging means so that data of smaller raster number and smaller X-axis coordinate can be selected from the input vector data, remaining intra-raster slant vectors and remaining extra-raster vectors, and supplies the selected data to the output-data generating means and to the remaining slant data generating means. The slant decomposing means also has arranging means provided to produce the developed output data in the order of smaller X-axis coordinate so that the order of the output data can be prevented from being opposed to the raster scanning direction (X-direction).

In addition, the data structure of input data that the slant decomposing means can decompose is composed of attribute data indicating the type of segment vector, segment data containing start-points and end-points or start-points and lengths of segment vectors, and decomposition information data for use in decomposition processing. Thus, a plurality of pieces of data can be expressed by rewriting the segment data while the decomposition information and segment data are being referred to.

Since the slant decomposing means has the above construction and receives the above data structure, data can be sequentially processed while it is being arranged in the raster scanning direction (X-direction). Moreover, since the arrangement condition is kept, the pipeline processing can be performed for each unit of segment data in the raster scanning direction, thus leading to fast processing and small-sized circuits.

The output data from the vector developing means that has the repetition-compressed data restoring means, slant decomposing means and so on is supplied to ends separating means so that the two start-point and end-point can be produced separated away from a horizontal segment vector. The ends-separating means has ends-producing means and arranging means that arranges the output ends in the raster scanning direction (X-direction). Thus, data of ends is produced in the order of raster scanning, or in the order of smaller X-axis coordinate.

According to the above construction, the drawing apparatus using the raster scanning means is able to fast develop the input data into bitmapped data. In addition, since the compressed input data can be used, the storage devices for the input data become small-sized. In addition, since data is processed in raster units, the processor circuits can be miniaturized.

Embodiments of the invention will be described below.

FIG. 1 is a block diagram of an example according to the invention that is useful for explaining the embodiments. The drawing apparatus of this embodiment has a data-processing computer 101, vector data developing means 102, ends-separating means 103, overlap removing means 104, bitmapped data generating means 105, exposure control means 106, and an optical system 107. The data-processing computer 101 converts a polygon as designed data to pattern data expressed in segment vectors, and storing it. The vector data developing means 102 approximately develops the input data into segment vector data parallel in the raster scanning direction (X-direction). The end separating means 103 processes a segment vector to produce the two ends of start-point and end-point separated away from the segment vector. The overlap removing means 104 removes the overlap between figures. The bitmapped data generating means 105 generates bitmapped data. The exposure control means 106 stores the produced bitmapped data, and controls the charged particle beam by using this data at the time of drawing. The optical system 107 is used for the exposure.

The outline and operation of each processing means will be described below.

Figures 5, 6, 7:
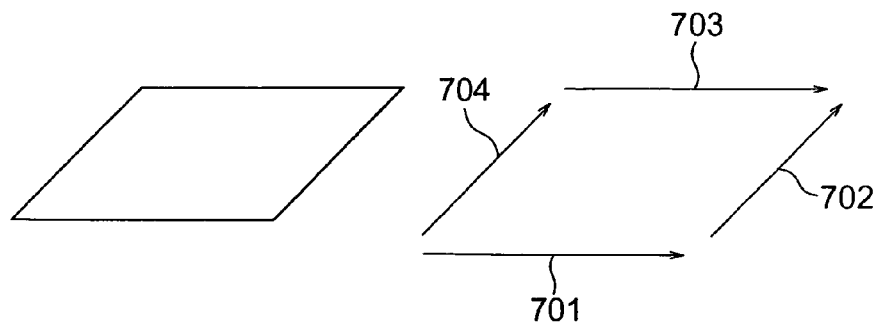
FIG. 5 is a diagram showing a conventional pattern expressed in a binary bit map.
FIG. 6 is a diagram showing the data structure of segment vector data in the embodiments of the invention.
FIG. 7 is a diagram showing an example of the vectors of a polygon in the embodiments of the invention.

FIG. 6 is a diagram showing the structure of the output data from the computer 101. As indicated by data 601, segment vector data contains attribute data indicative of segment type, segment data formed of start-point and end-point or start-point and length, and additional data formed of parameters that are used when the vector data is processed to develop.

The figure shown in FIG. 7 can be expressed by segments 701, 702, 703 and 704 according to the outline vector notation. The attributes such as upper side and lower side are added to indicate on what sides those segments are located.

As illustrated in FIG. 7, segments 703 and 704 located on the upper side of the figure are defined as upper-side segments, while segments 701 and 702 located on the lower side as lower-side segments.

Figure 8:
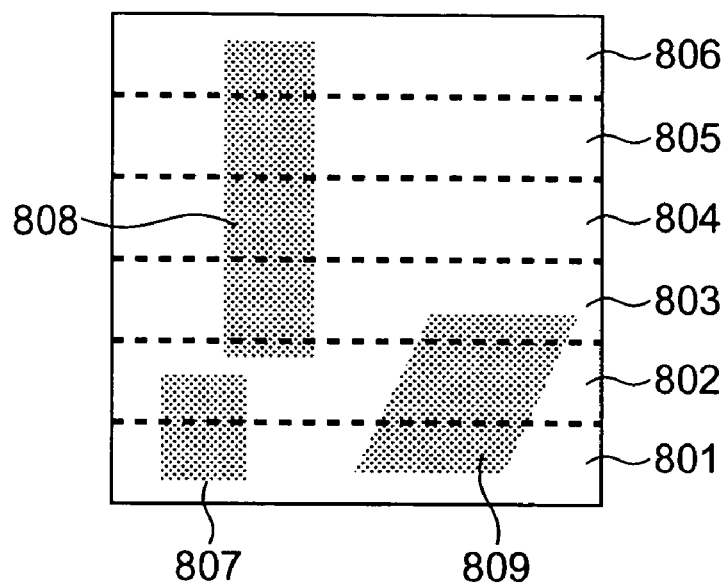
FIG. 8 is a diagram showing an example of depicted pattern in the embodiments of the invention.
Figure 9:
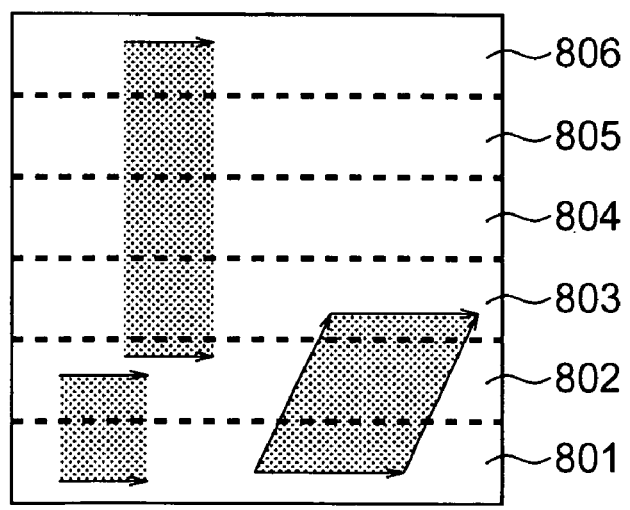
FIG. 9 is a diagram showing an example of depicted pattern expressed in segment vectors in the embodiments of the invention.

An example of the array order of data will be mentioned with reference to FIG. 8. FIG. 8 shows a depicted area sectioned by rasters 801, 802, 803, 804, 805 and 806. This area includes a plurality of figures (a rectangle 807, a rectangle 808 and a trapezoid 809). As illustrated in FIG. 9, the vectors of the segments perpendicular to the raster scanning direction (X-direction) are omitted in order to reduce the amount of data. This is because the vertical segments can be expressed according to the start-point information of lower side and upper side segments. The segment data are grouped by rasters according to the start-point information. The segment data included in the same raster are arranged in the raster scanning direction, or in the order of X-axis coordinate. In other words, the segment vector data are arranged in the raster scanning order according to their start-points, and thus supplied to the vector data developing means in this order.

Figure 10:
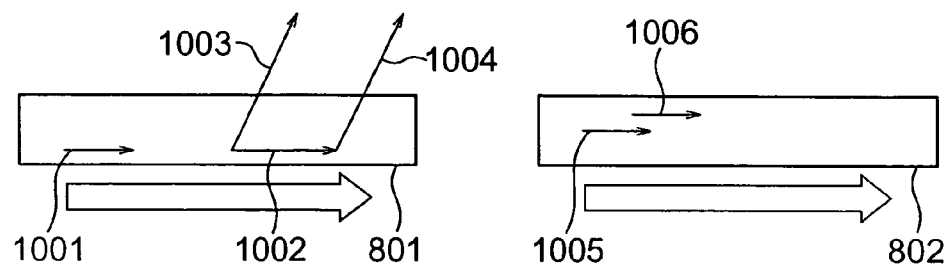
FIG. 10 is a diagram showing the pattern data of each raster unit in the embodiments of the invention.

FIG. 10 shows the segment vector data of raster units grouped by rasters. The segment vectors are supplied to the vector data developing means in the order of segments 1001, 1002, 1003, 1004, 1005, 1006 and so on. The reason why the segment vectors are arranged as above is to cause the bitmapped data to be generated with high speed. The case in which the start-points included in the same raster are located at the same position is treated so that the data can be processed easily.

Figure 11:
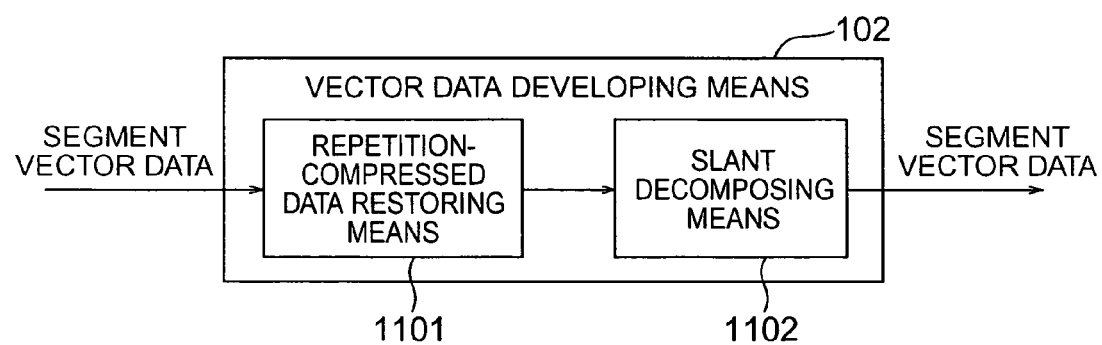
FIG. 11 is a block diagram showing the construction of vector data developing means in the embodiments of the invention.

FIG. 11 shows the construction of the vector data developing means. It consists of repetition-compressed data restoring means 1101 and slant-decomposing means 1102. If the above-mentioned computer does not compress the repetition of data, the repetition-compressed data restoring means 1101 can be removed. In addition, the slant-decomposing means 1102 and the repetition-compressed data restoring means 1101 may be changed in their order.

Figure 12:
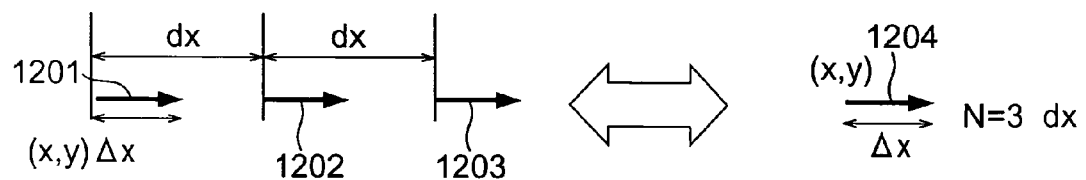
FIG. 12 is a diagram showing an example of the operations for compressing repetitive data and restoring the repetition-compressed data in the embodiments of the invention.

The repetition-compressed data will be described with reference to FIG. 12. As illustrated in FIG. 12, a plurality of segments 1201, 1202 and 1203 of the same length Δx are repeatedly fed at intervals of repletion width dx. If those segments are represented by a segment 1204 that has, as illustrated, the start-point (x, y) of the reference segment 1201, length (Δx), repetition width (dx) and repetition number (N=3), the amount of data of those segments can be reduced to that of the segment 1204. The repetition-compressed data restoring means 1101 restores the above compressed data to the original group of segments.

Figure 13:
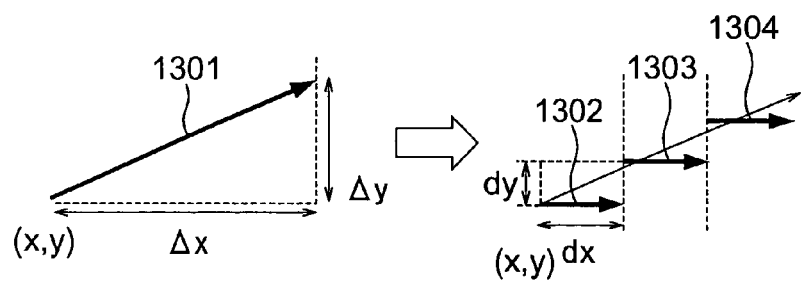
FIG. 13 is a diagram showing an example of the slant decomposing operation in the embodiments of the invention.

The slant-decomposing means 1102 will be described next. This means 1102 decomposes a slant vector into a group of horizontal segments arranged in the raster scanning direction (X-direction). In other words, a slant vector 1301 defined by the start-point (x, y), the horizontal (X-axis direction) length (Δx) and a vertical (Y-axis direction) length (Δy), as illustrated in FIG. 13, is decomposed into segments 1302, 1303 and 1304 according to decomposition information data (dx, dy). The dx is the length of each segment parallel to the raster scanning direction (X-direction), and dy the interval between the segments in the direction perpendicular to the raster scanning direction (X-direction).

Figure 14:
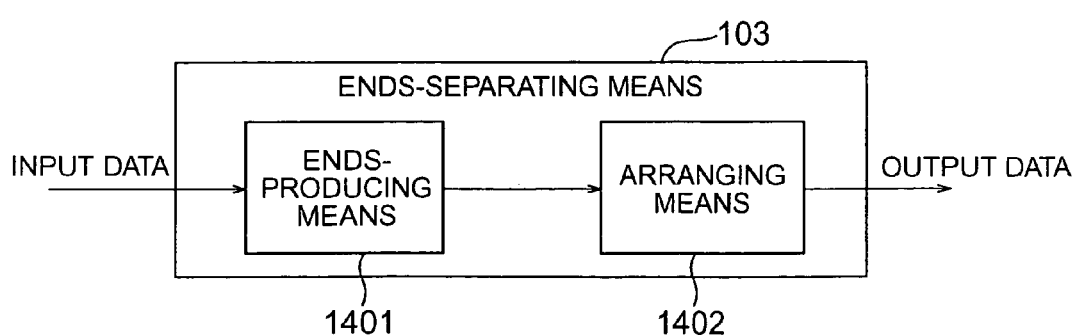
FIG. 14 is a diagram showing the construction of the ends-separating means in the embodiments of the invention.

The ends separating means will be mentioned below. It processes horizontal vector data to separate the start-point and end-point from the data. FIG. 14 shows the construction of the ends separating means 103. The means 103 includes ends-producing means 1401 that decomposes segment data into ends, and arranging means 1402 that arranges the ends according to the coordinates data.

Figure 15:
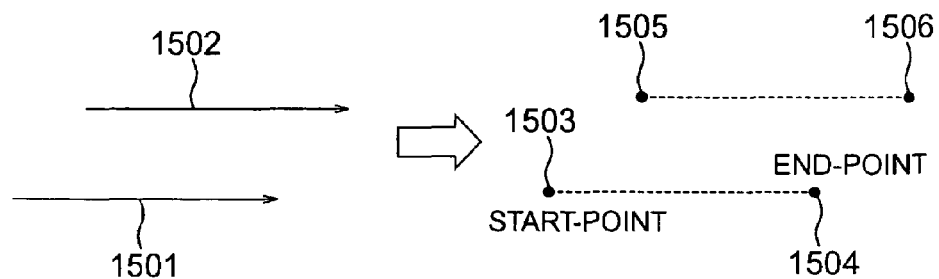
FIG. 15 is a diagram showing an example of the ends-separating operation in the embodiments of the invention.
Figure 16:
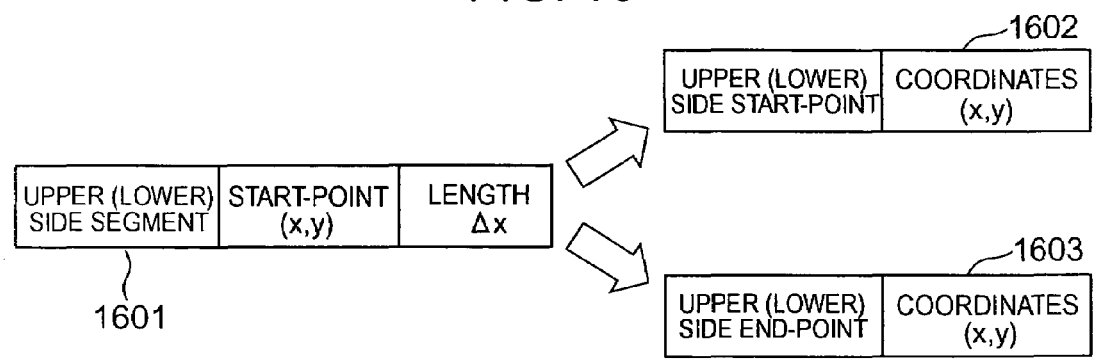
FIG. 16 is a diagram showing an example of the ends-separating operation by using data structure.

The ends producing means 1401 decomposes a segment 1501 shown in FIG. 15 into ends 1503 and 1504. If the segment is considered from data structure point of view, segment data 1601 formed of attribute, start-point and length is decomposed into an upper (lower) side start-point 1602 and an upper (lower) side end-point 1603 as shown in FIG. 16. Each end is formed of attribute and coordinates.

The arranging means 1402 will be described next. As an example, it is assumed that segments 1501 and 1502 are contained within the same raster as shown in FIG. 15. If the ends are produced in the decomposing order, ends 1503, 1504, 1505 and 1506 are produced in this order, but not in the raster scanning order (in the order of X-axis coordinate). Therefore, the arranging means 1402 rearranges data of ends into the order of 1503, 1505, 1504 and 1506 so that the array order can be prevented from being disturbed, and produces the ends in this order.

Figure 17:
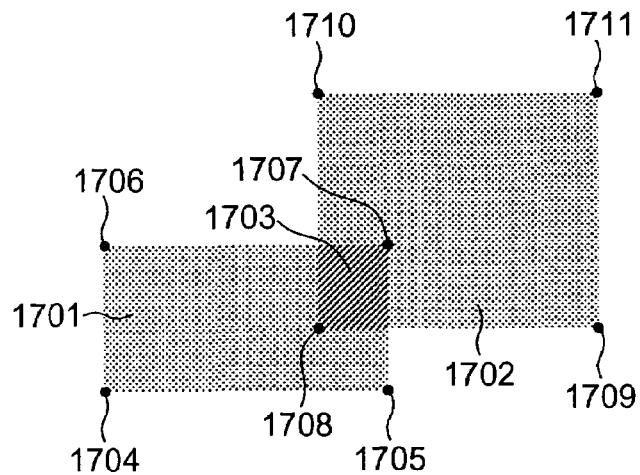
FIG. 17 is a diagram showing an example of depicted pattern in the embodiments of the invention.
Figure 18:
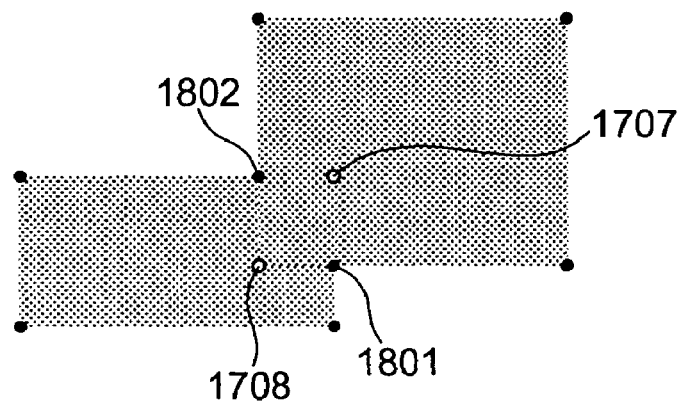
FIG. 18 is a diagram showing the overlap removing operation by using an example of depicted pattern in the embodiments of the invention.

The overlap removing means will be explained next. If the input data has a pattern shown in FIG. 17, FIGS. 1701 and 1702 are partially overlapped on each other as indicated by an overlap area 1703. At this time, the ends resulting from the ends separating operation can be given as lower side start-point 1704, lower side end-point 1705, upper side start-point 1706 and upper side end-point 1707 of the FIG. 1701, and as lower side start-point 1708, lower side end-point 1709, upper side start-point 1710 and upper side end-point 1711 of the FIG. 1702. The overlap removing means judges the overlap from the above input end coordinates, and as a result it eliminates the upper side end-point 1707 and lower side start-point 1708, and newly defines an upper side end-point 1802 and a lower side start-point 1801 as shown in FIG. 18. Thus, the overlap area 1703 can be removed.

Figure 19:
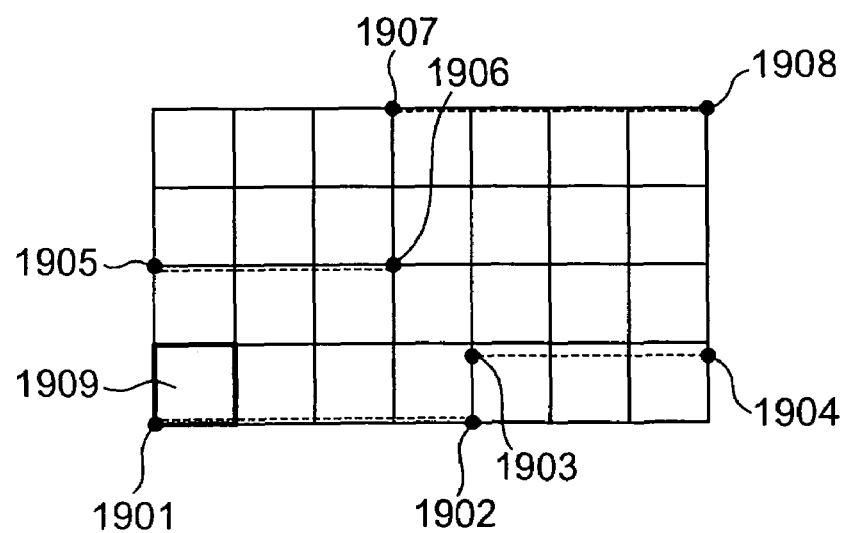
FIG. 19 is a diagram showing an example of depicted pattern in the embodiments of the invention.
Figure 20:
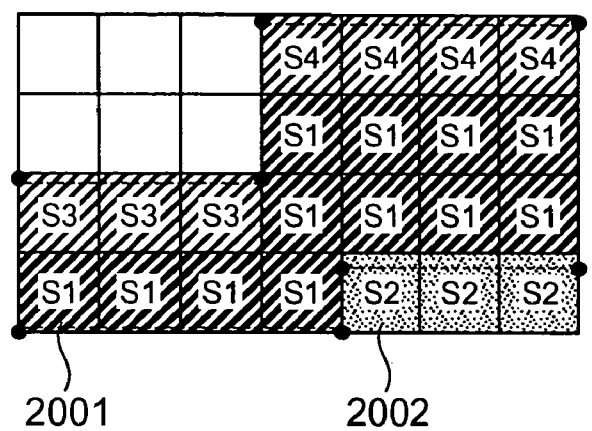
FIG. 20 is a diagram showing the bitmap developing operation by using an example of depicted pattern in the embodiments of the invention.
Figure 21:
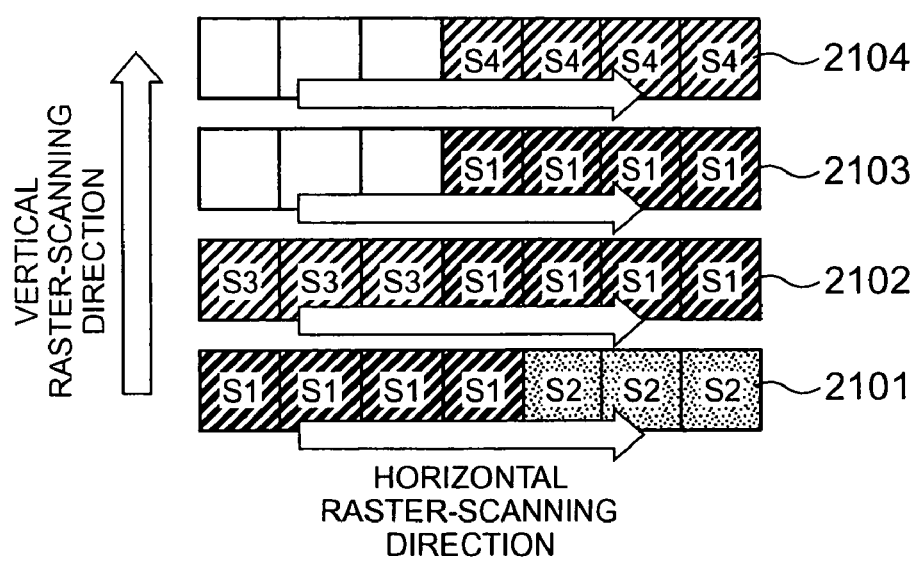
FIG. 21 is a diagram showing the processing order of the bitmap developing operation in the embodiments of the invention.

The bitmapped data generating means will be described below. This means sequentially generates multi-valued bitmapped data from the correctly arranged data of ends after the above overlap area has been removed. It is here assumed that upper side start-points 1905, 1907, upper side end-points 1906, 1908, lower side start-points 1901, 1903, and lower side end-points 1902, 1904 are supplied as input data as shown in FIG. 19. In FIG. 19, an area 1909 is a pixel. The bitmapped data generating means computes the area rate of each pixel of the figure, and causes a memory to store the computed value at the corresponding address. That is, as illustrated in FIG. 20, an area rate S1 is stored at the address corresponding to a pixel 2001, and an area rate S2 at the address corresponding to a pixel 2002. As to the order of processing, the pixels are processed in the order of horizontal lines, or rasters 2101, 2102, 2103 and 2104, and in the raster scanning order as shown in FIG. 21.

The value of each pixel of the generated bitmapped data is written in a small-scale storage device. At the time of drawing, this data is read out in the depicted order by the exposure control means, and converted pixel by pixel to exposure control data. The drawing apparatus uses this control data to control the amount of exposure and draw.

Embodiments of the invention having the above construction will be described below.

First Embodiment

A system will be described in detail in which the vector developing means and the following means are constructed by hardware, and the pipeline processing is performed to sequentially generate bitmapped data in the raster scanning direction. It is assumed that the designed data is already converted to intermediate data by the above data-processing computer, and that the input data to the vector-developing means is segment vectors correctly arranged in the raster scanning order with the start-point coordinates used as a reference.

Figure 22:
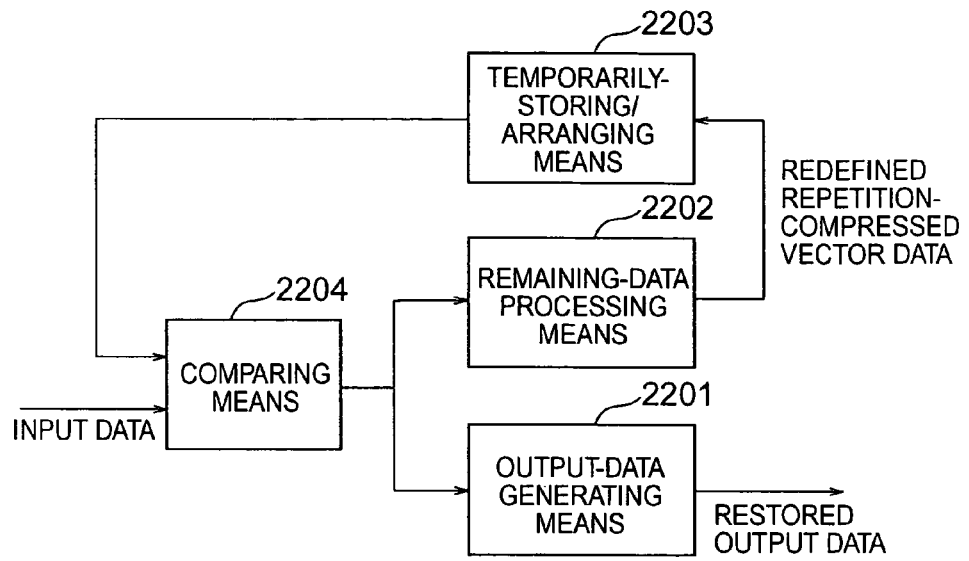
FIG. 22 is a diagram showing the construction of the repetition-compressed data restoring means in the embodiments of the invention.

The repetition-compressed data restoring means receives segment vectors arranged in the raster scanning order, and sequentially processes those vectors. FIG. 22 shows a specific construction of a one-dimensional repetition-compressed data restoring means. The repetition-compressed data restoring means includes output-data generating means 2201, remaining data processing means 2202, temporarily-storing/arranging means 2203 and comparing means 2204. The output-data generating means 2201 processes repetition-compressed vector data in the order of smaller raster scanning direction (X-axis) coordinate. The remaining data processor 2202 again defines the remaining repetition-compressed vectors except the output data as repetition-compressed vector data. The temporarily-storing/arranging means 2203 arranges the redefined repetition-compressed vector data in the order of smaller raster scanning (X-axis) coordinate, and stores the arranged data. The comparing means 2204 compares input data and the output data from the temporarily-storing/arranging means.

Figure 23:
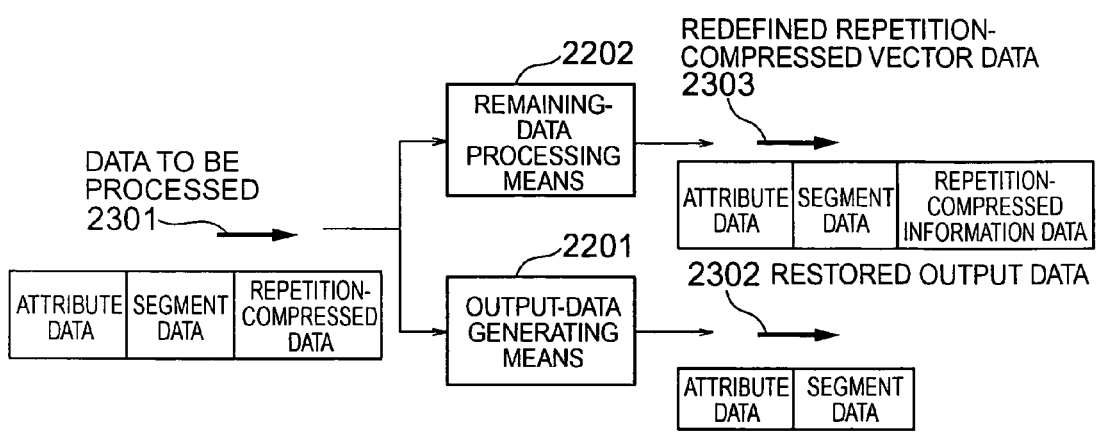
FIG. 23 is a diagram showing the operations of the output data generating means and remaining data processing means provided within the repetition-compressed data restoring means in the embodiments of the invention.

The operation of output-data generating means 2201 and remaining data processing means 2202 will be schematically described with reference to FIG. 23. If input data 2301 is the repetition-compressed vector data that is composed of attribute data, segment data and repetition information data, the output-data generating means 2201 generates output data 2302 formed of attribute data and segment data. The remaining-data processing means redefines the remaining data to produce repetition-compressed vector data 2303. If the input data is not repetition-compressed vector data, the output-data generating means 2201 generates output data 2302, and the remaining-data processor stops the processing.

Figure 24:
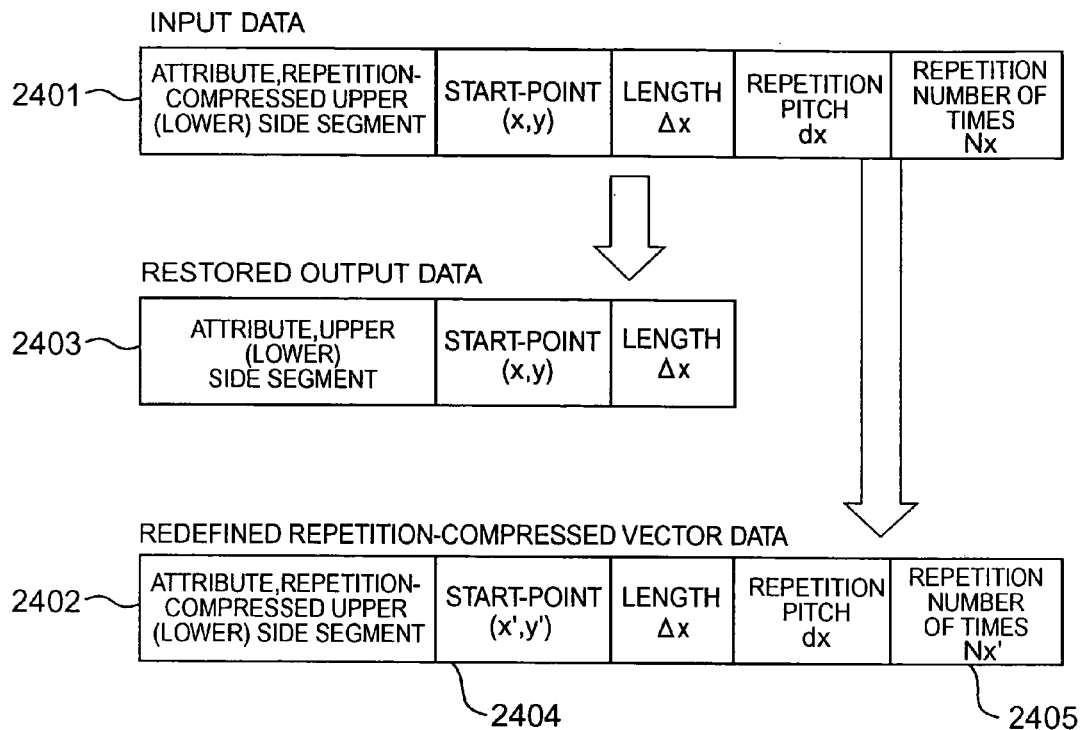
FIG. 24 is a diagram showing the operations of the output data generating means and remaining data processing means provided within the repeated data restoring means by using data structure in the embodiments of the invention.

The processing operation of each means will be described by using data structure. An example will be given about the case of processing repetition-compressed vector data 2401 formed of attribute, start-point (x, y), length Δ, repetition pitch dx and repetition number of times Nx as shown in FIG. 24. The output-data generating means 2201 generates output data 2403, and the remaining-data processing means 2202 redefines the input data to produce repetition-compressed vector data 2402. The output data 2403 is composed of attribute, start-point (x, y) and length Δx. In other words, the output-data generating means 2201 cuts away the repetition information data (repetition pitch dx, repetition number of times Nx), and redefines the attribute. The remaining-data processing means 2202 redefines start-point information 2404 ((x', y')=(x+dx, y)) and parameter information of repetition number of times (Nx'=Nx−1) according to an equation to produce repetition-compressed vector data 2402. The other information is the same as the repetition-compressed vector data 2401 before the processing.

The redefined data 2402 is stored in the temporarily-storing/arranging means 2203. The temporarily-storing/arranging means 2203 arranges data and stores it when data are overlapped during the restoration of multiple segments. The comparing means 2204 compares the raster scanning direction (X-axis) coordinate data of the repetition-compressed vector data produced from the temporarily-storing/arranging means and that of the next input data. As a result, it supplies the smaller one to the output-data generating means 2201 and to the remaining-data processing means 2202.

Since each processing means processes data of the above data structure, the output data can be continuously produced without disturbing the raster scanning order.

Figure 25:
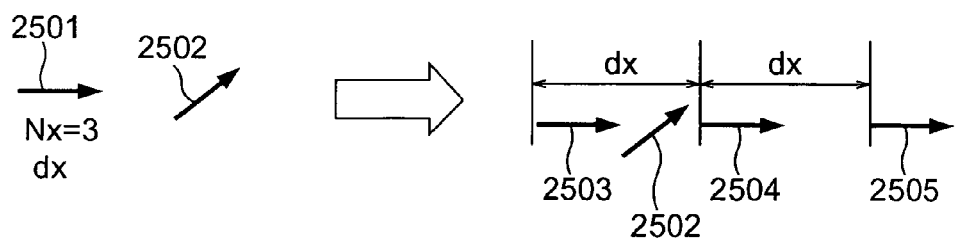
FIG. 25 is a diagram showing the arranging operation in the repetition-compressed data restoring means in the embodiments of the invention.

The function to arrange during the restoration operation will be described with reference to FIG. 25. In FIG. 25, information of start-point and length is omitted. When repetition-compressed vector data 2501 and slant vector data 2502 are inputted in this order, the output-data generating means 2201 first processes the inputted repetition-compressed vector data 2501 to generate segment vector data 2503. The remaining-data processing means 2202 redefines the input data to produce repetition-compressed vector data 2504 (including 2505) and supplies it to the temporarily-storing/arranging means 2203. Then, the comparing means compares the start-point information of the inputted vector data 2502 and that of the vector data 2504 (including 2505). As a result, the input data 2402 of smaller X-coordinate is supplied to the output-data generating means 2201 and remaining-data processing means 2202. Subsequently, the repetition-compressed vector data 2504 (including 2505) is similarly processed, and the segment vector data 2504 and 2505 are produced in this order.

Figure 26:
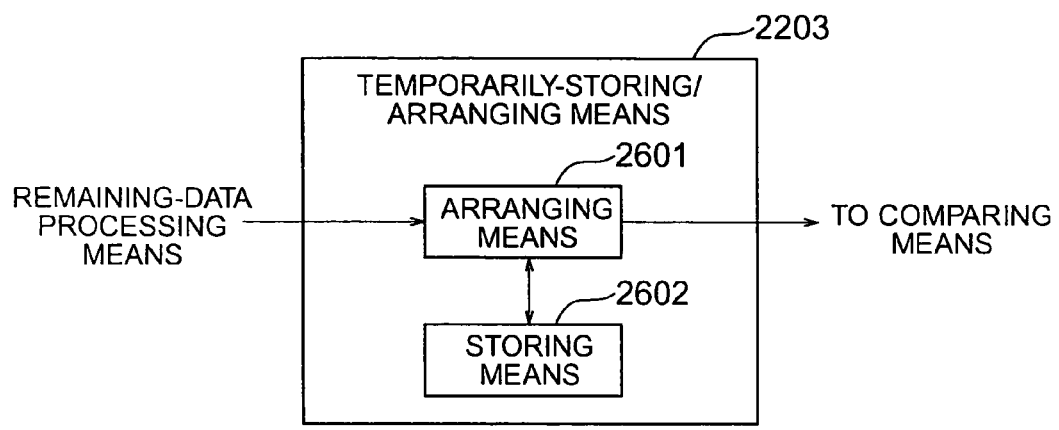
FIG. 26 is a diagram showing the construction of the temporarily-storing/arranging means in the embodiments of the invention.

The arranging process in the temporarily-storing/arranging means will be described next. An example will be given about the case of overlapped data during the restoration of multiple segments. The temporarily-storing/arranging means 2203 compares the start-points of inputted data, rearranges the input data so that the smaller one can be first produced, and stores the rearranged data. The temporarily-storing/arranging means 2203 includes arranging means 2601 and storing means 2602 as shown in FIG. 26.

Figure 27:
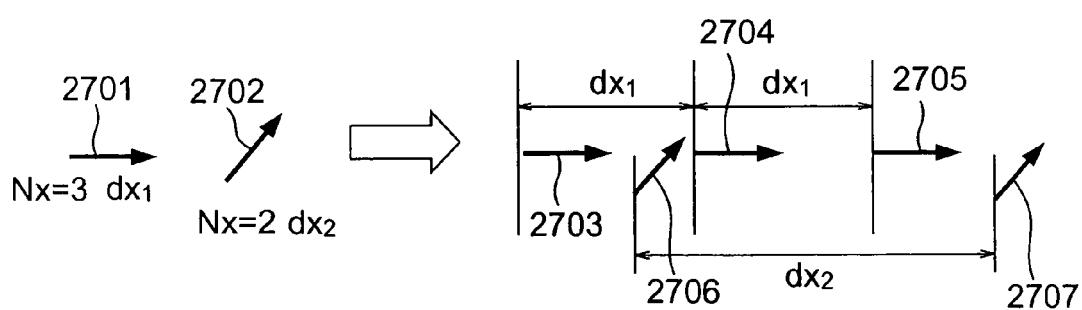
FIG. 27 is a diagram showing an example of the arranging operation of the temporarily-storing/arranging means provided within the repetition-compressed data restoring means in the embodiments of the invention.

The restoring operation shown in FIG. 27 will be considered as an example. In FIG. 27, information of start-point and length is omitted. When repetition-compressed vector data 2701 and repetition-compressed slant vector data 2702 are inputted in this order, the output-data generating means 2201 first processes the inputted vector data 2701 to generate and supply segment vector data 2703. The remaining-data processing means 2202 redefines the input data to produce vector data 2704 (including 2705), and supplies it to the temporarily-storing/arranging means 2203. Then, the comparing means 2204 compares the start-point information of the input vector data 2702 and that of vector data 2704 (including 2705). As a result, the comparing means 2204 supplies the input data 2702 of smaller X-coordinate to the output-data generating means 2201 and to the remaining-data processing means 2202. Those means generate and supply slant vector data 2706 and repetition-compressed vector data 2707 (strictly speaking, slant vector data).

At this time, the temporarily-storing/arranging means 2203 holds two pieces of repetition-compressed vector data, 2704 (including 2705) and 2707. This means 2203 compares their X-coordinate data, and supplies data 2704 (including 2705) of smaller X-coordinate to the comparing means 2204. Since input data is not fed to the comparing means 2204, it supplies the vector data 2704 (including 2705) to the output-data generating means 2201 and to the remaining-data processing means 2202. As to the following processing, too, the comparing means 2204 and temporarily-storing/arranging means 2203 make the arranging operation as above, thus producing segment data 2704, 2705 and 2707 in this order.

Figure 28:
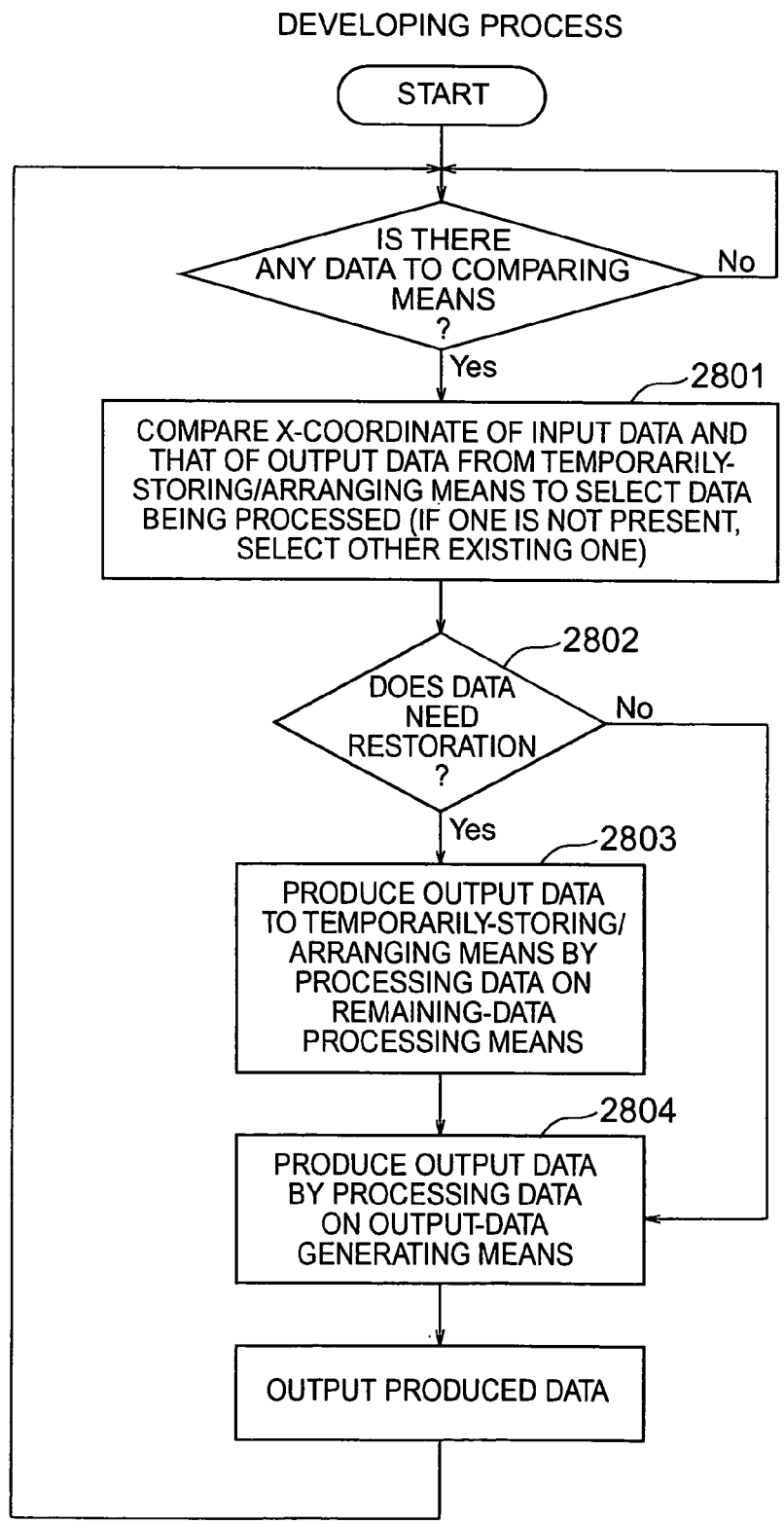
FIG. 28 is a flowchart for the operation of the repetition-compressed data restoring means in the embodiments of the invention.

FIG. 28 is a flowchart for the operation of the repetition-compressed data restoring processing means. It is assumed that the temporarily-storing/arranging means arranges the input data as above and produces arranged data. In step 2801, the comparing means compares two pieces of input data about the start-point information and supplies data according to arrangement condition to the output-data generating means 2201 and to the remaining-data processing means 2202. In step 2802, judgment is made of whether the data needs the restoring operation. If data does not need restoration, the program goes to step 2804, where the output-data generating means 2201 generates and supplies output data. If data needs restoration, the program goes to step 2803, where the remaining-data processing means 2202 redefines the repetition-compressed vector data, and supplies it to the temporarily-storing/arranging means 2203. In addition, in step 2804, the output-data generating means 2201 generates and supplies output data.

Figure 29:
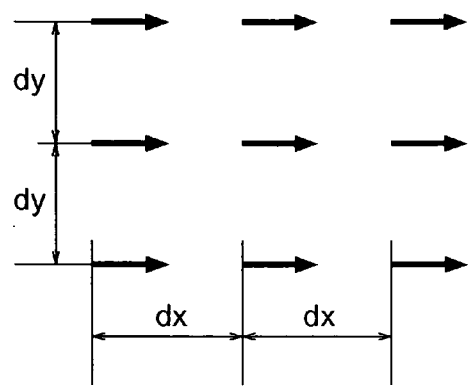
FIG. 29 is a diagram showing an example of the two-dimensional repletion-compressed data restoring operation in the embodiments of the invention.
Figure 30:
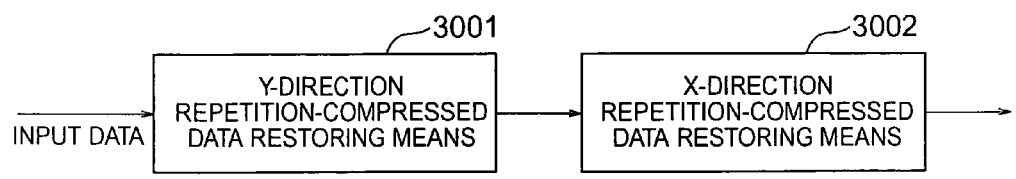
FIG. 30 is a diagram showing the construction of the two-dimensional repetition-compressed data restoring means in the embodiments of the invention.

The means for restoring two-dimensional compressed data will be described below. So far, we have mentioned only the one-dimensional (X-direction) restoration. As illustrated in FIG. 29, there is a case in which segment vectors are two-dimensionally repeated only about their positions with the repetition pitch dx and repetition number of times Nx of X-axis direction and the repetition pitch dy and repetition number of times Ny of Y-axis direction but with the same length and attribute. As shown in FIG. 30, Y-direction repetition-compressed data restoring means 3001 is connected in series to X-direction repetition-compressed data restoring processing means 3002. The arrangement order of those means may be arbitrary. The data structure, as shown in FIG. 31, has additionally the repetition pitch (dy) and repetition number of times (Ny) as the Y-direction restoration information. The X-direction repetition-compressed data restoring processor 3001 is the same as mentioned previously, and hence will not be described.

The Y-direction repetition-compressed data restoring means 3002 will be described next. The arrangement condition of data includes the order of smaller raster number, and the order of smaller X-axis coordinate within each raster. Thus, the operation for processing such redefined data as to go beyond a raster or rasters is added to the one-dimensional restoration operation mentioned so far.

Figure 32:
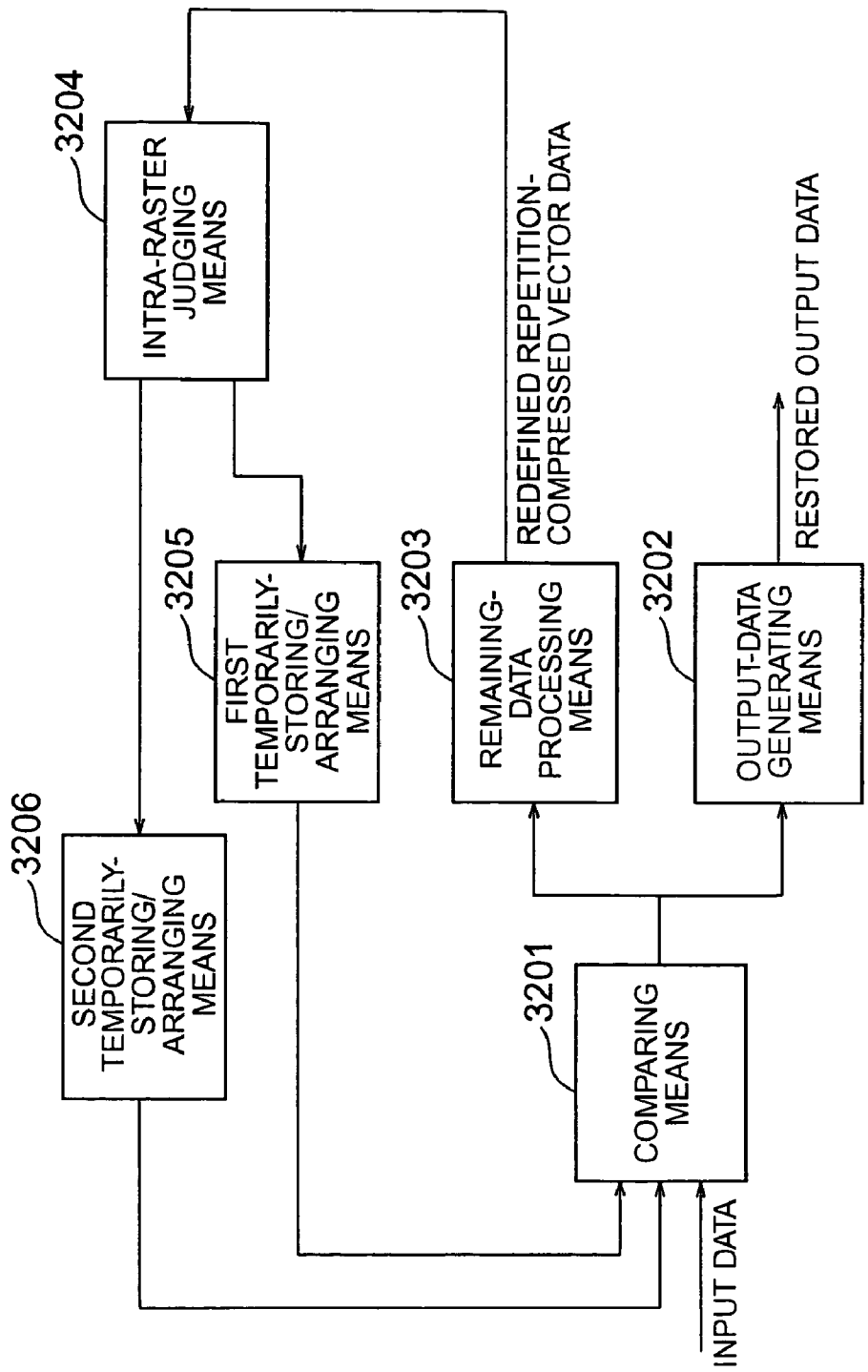
FIG. 32 is a diagram showing the construction of the Y-direction repletion-compressed data restoring means in the embodiments of the invention.

As illustrated in FIG. 32, the Y-direction repetition-compressed data restoring means 3002 is comprised of comparing means 3201, output-data generating means 3202, remaining-data processing means 3203, intra-raster judging means 3204, first temporarily-storing/arranging means 3205 and second temporarily-storing/arranging means 3206. The comparing means 3201 compares three pieces of input data about raster number. (Y-axis direction) and raster scanning direction (X-axis) coordinate. The output-data generating means 3202 processes data in the order of smaller X-axis coordinate. The remaining-data processing means 3203 again defines the remaining repetition-compressed vector data except the output data as repletion-compressed vector data. The intra-raster judging means 3204 judges whether data is included within the current raster. The first temporarily-storing/arranging means 3205 arranges the intra-raster data in the order of smaller X-coordinate according to the result from the intra-raster judging means 3204, and stores them. The second temporarily-storing/arranging means 3206 arranges extra-raster data in the order of smaller Y-axis coordinate and X-axis coordinate according to the result from the intra-raster judging means 3204, and store them.

The comparator 3201 compares pieces of data to generate data of smaller raster number (Y-axis direction) and smaller X-coordinate. The second temporarily-storing/arranging means 3206 processes data to arrange in the order of smaller Y-coordinate and smaller X-coordinate. The first temporarily-storing/arranging means 3205 arranges data only in the order of smaller Y-coordinate because only the data arranged in the order of smaller X-coordinate is supplied to this means. The data structure and the equation for computation are the same as in the X-direction restoration, and thus will not be described.

Figure 33:
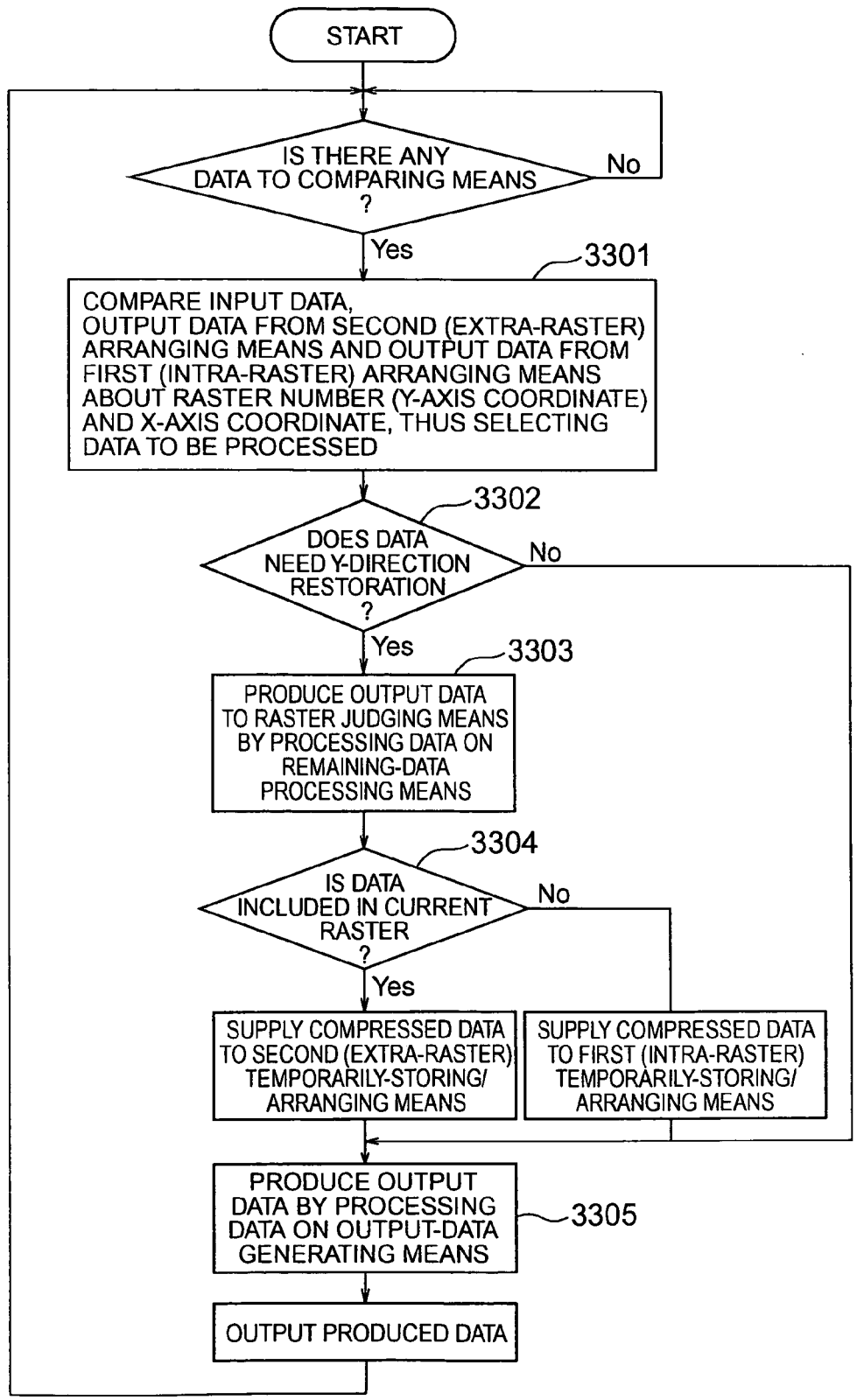
FIG. 33 is a flowchart for the operation of the Y-direction repetition-compressed data restoring means in the embodiments of the invention.

FIG. 33 is a flowchart for the operation. It is assumed that the above first and second temporarily-storing/arranging means arrange the input data and produce the arranged data. In step 3301, the comparing means 3201 compares three pieces of input data about start-point information, and supplies data according to the arrangement condition to the output-data generating means 3202 and to the remaining-data processing means 3203. In step 3302, judgment is made of whether data needs restoration. If data does not need restoration, the program goes to step 3305, where the output-data generating means 3202 generates and supplies output data. If data needs restoration, the program goes to step 3303, where the remaining-data processing means 3203 redefines the repetition-compressed vector data, and supplies it to the intra-raster judging means 3204. In step 3304, the intra-raster judging means 3204 judges whether data is included within the current raster from the start-point information of the repetition-compressed vector data. If data is within the current raster, the intra-raster judging means 3204 supplies this data to the second temporarily-storing/arranging means 3206. If data is not within the current raster, or it is extra-data, the judging means 3204 supplies this data to the first temporarily-storing/arranging means 3205. In step 3305, the output-data generating means 3202 generates and supplies output data.

By using the hardware structure mentioned above, it is possible to orderly determine and restore output data without disturbing the arrangement order.

Figure 34:
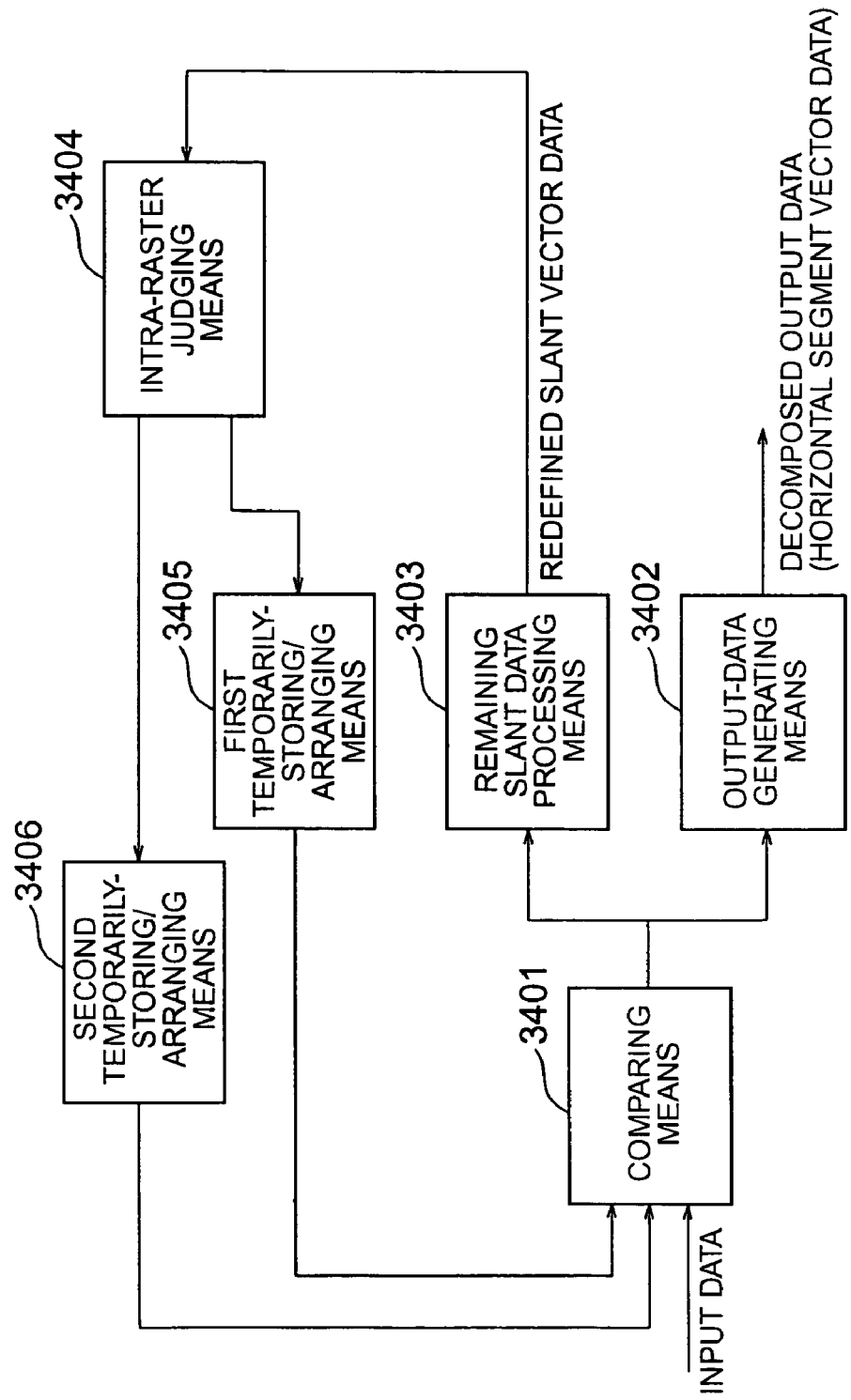
FIG. 34 is a diagram showing the construction of the slant decomposing means in the embodiments of the invention.

The slant-decomposing means will be described below. The concept of the slant-decomposing means is the same as the above repetition-compressed data restoring means. FIG. 34 shows the construction of the slant-decomposing means. As illustrated, the construction is the same as the Y-direction repetition-compressed data restoring means 3001. The slant-decomposing means is composed of comparing means 3401, output-data generating means 3402, remaining-data processing means 3403, intra-raster judging means 3404, first temporarily-storing/arranging means 3405 and second temporarily-storing/arranging means 3406. The comparing means 3401 compares three pieces of input data about raster number (Y-axis direction) and X-axis coordinate. The output-data generating means 3402 processes data in the order of smaller X-axis coordinate. The remaining-data processing means 3403 redefines the remaining slant vector data except the output data as slant vector data. The intra-raster judging means 3404 judges whether data is included within the current raster. The first temporarily-storing/arranging means 3405 arranges the intra-raster data in the order of smaller X-axis coordinate according to the result from the intra-raster judging means 3404, and storing it. The second temporarily-storing/arranging means 3406 arranges the extra-raster data in the order of smaller raster number (Y-axis direction) and smaller X-axis coordinate according to the result from the intra-raster judging means 3404, and stores it.

The comparing means 3401 first selects data of smaller raster number (Y-axis direction) and smaller X-axis coordinate. The second temporarily-storing/arranging means 3406 also arranges data under the same condition. The first temporarily-storing/arranging means 3403 arranges data only in the order of smaller X-axis coordinate because data of the same raster is supplied to this means. The temporarily-storing/arranging means are of the same construction as the arranging means provided within the previously given repetition-compressed data restoring means, but only different in the arrangement condition. Thus, these means will not be described in detail.

Figure 35:
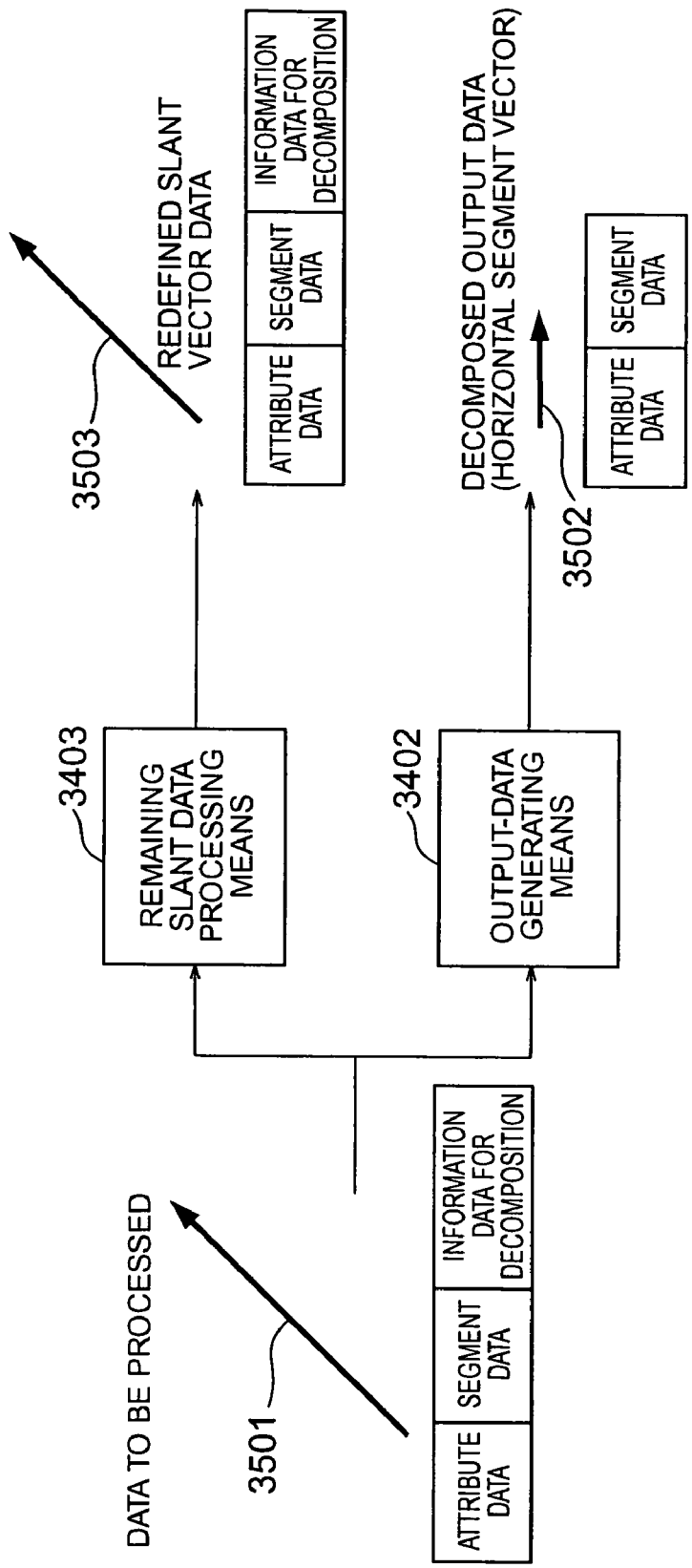
FIG. 35 is a diagram showing the operations of the output data generating means and remaining data processing means provided within the slant decomposing means in the embodiments of the invention.

The operation of output-data generating means 3402 and remaining-data processing means 3403 will be schematically explained with reference to FIG. 35. If data 3501 selected by the comparing means 3401 is slant vector data that is formed of attribute data, segment data and decomposition information data, the output-data generating means 3402 generates output data 3502 composed of attribute data and segment data, and the remaining slant data processing means redefines the input data to produce slant vector data 3503. If the input data is not slant vector, the output-data generating means 3402 generates output data 3502, but the remaining slant data processing means does not process the input data.

Figure 36:
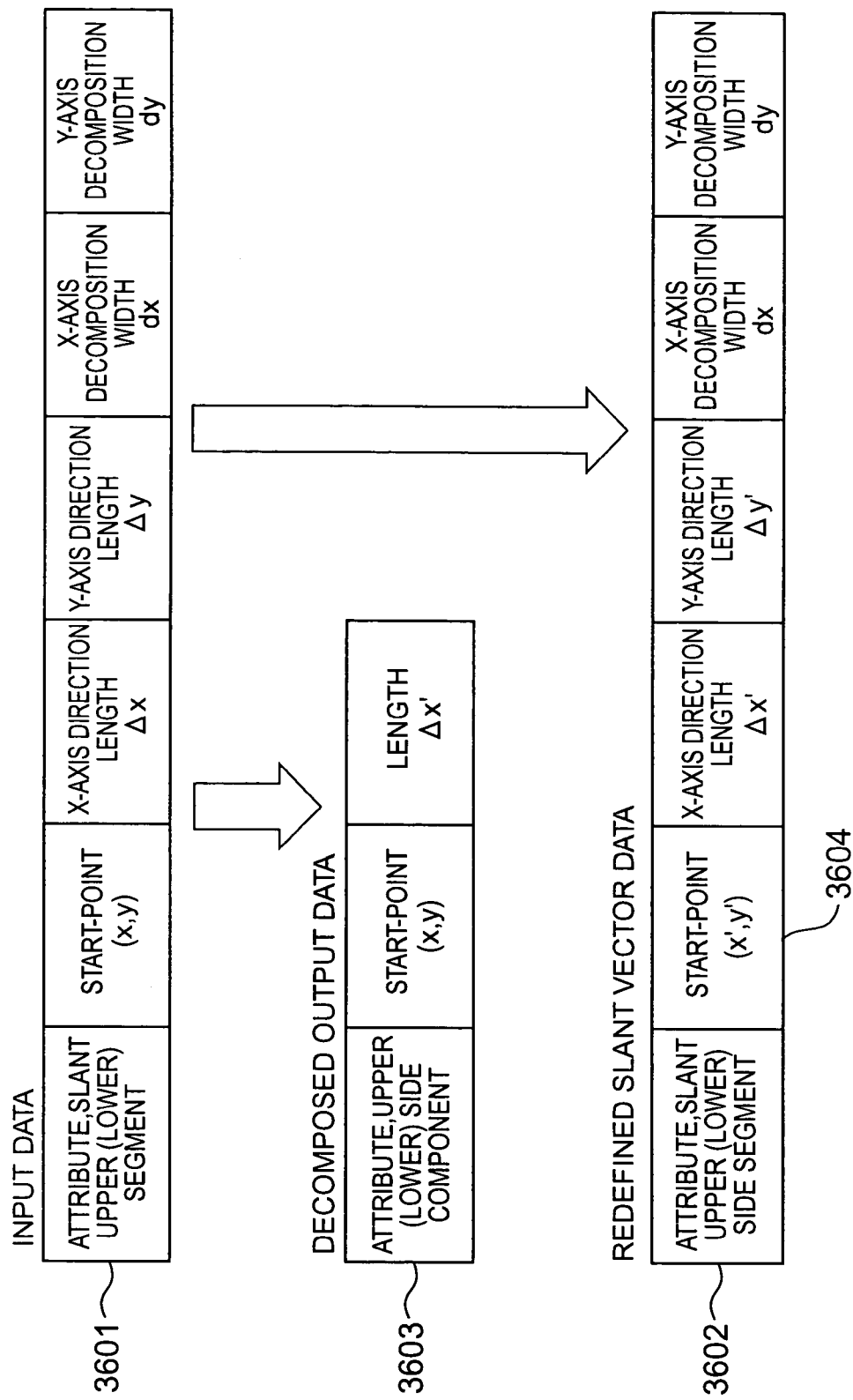
FIG. 36 is a diagram showing the operations of the output data generating means and remaining data processing means provided within the slant decomposing means by using the data structure in the embodiments of the invention.

Each processing operation will be described by using data structure. As illustrated in FIG. 36, an example is given about the case of processing slant vector data 3601 that is comprised of attribute, start-point (x, y), lengths $\Delta x$ and $\Delta y$, X-direction decomposition width dx, and Y-direction decomposition dy. The output-data generating means 3402 generates output data 3603, and the remaining-data processing means 3403 generates slant vector data 3602. The output data 3603 is segment vector data formed of attribute, start-point (x, y) and length ($\Delta x'$=dx). The remaining-data processing means 3403 makes fixed computation of start-point (x', y')=(x+dx, y+dx) and length ($\Delta x'$, $\Delta y'$)=($\Delta x$−dx, $\Delta y$−dy), and produces slant vector data 3602. Other information is the same as the inputted slant vector data 3601. At the decomposing time, the way to compute for the attribute of slant is different from that for segment definition as described in detail later.

After the above computation, the intra-raster judging means 3404 judges whether the redefined slant vector data is included within the current raster from its start-point, and supplies the intra-raster data to the fixed temporarily-storing/arranging means 3405. Then, the comparing means 3401 compares the next input data with each output from the temporarily-storing/arranging means 3405, 3406.

Figure 37:
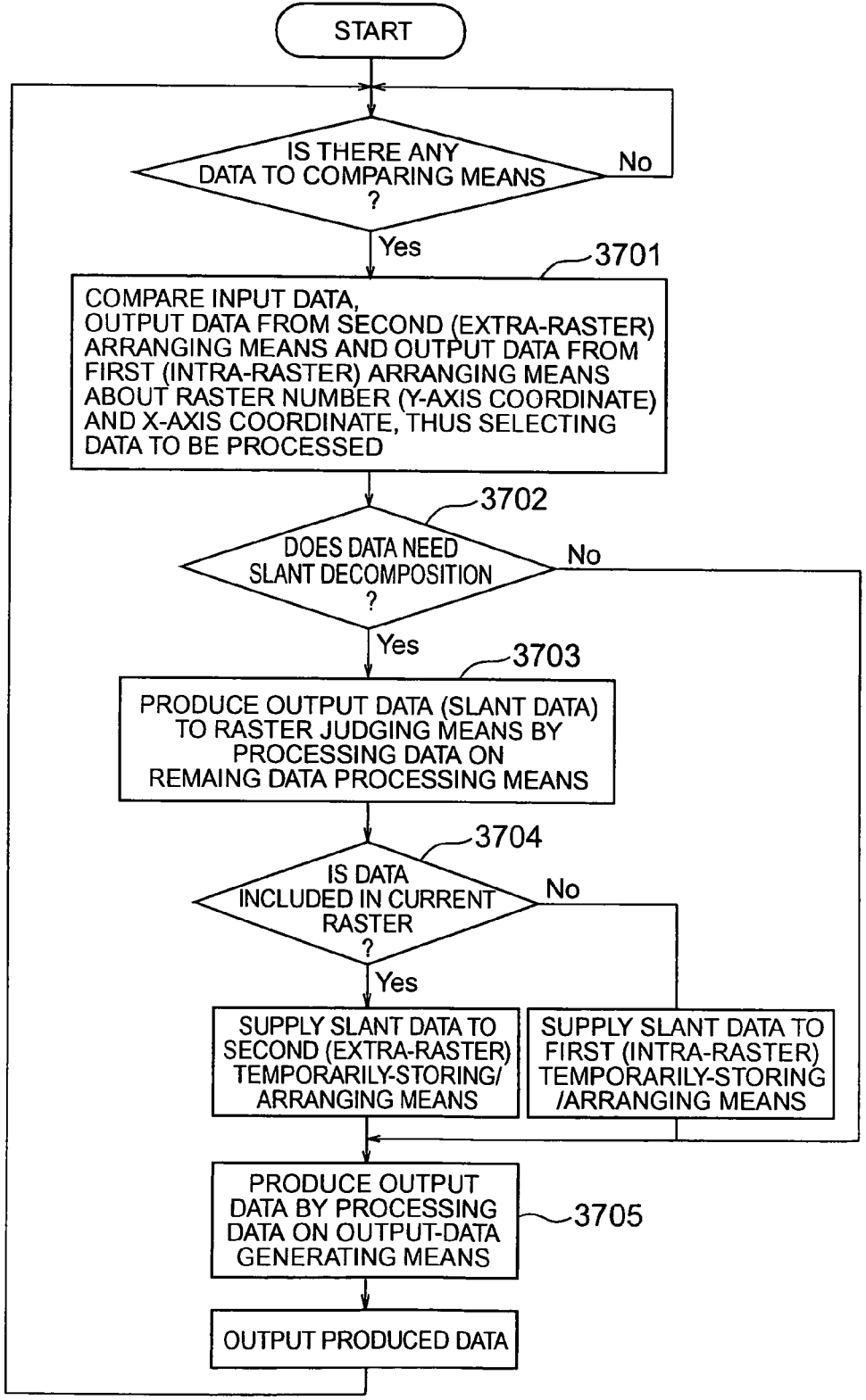
FIG. 37 is a flowchart for the operation of the slant decomposing means in the embodiments of the invention.

FIG. 37 is a flowchart for the operation. It is assumed that the first and second temporarily-storing/arranging means 3405, 3406 arrange the input data as described above, and they produce the arranged data. In step 3701, the comparing means 3401 compares three pieces of input data about start-point information, and supplies data in the order of arrangement condition to the output-data generating means 3402 and to the remaining-data processing means 3403. In step 3702, judgment is made of whether data needs decomposition. If data does not need decomposition, the program goes to step 3705, where the output-data generating means 3202 generates and supplies output data. If data needs decomposition, the program goes to step 3703, where the remaining-data processing means 3403 redefines slant vector data, and supplies it to the intra-raster judging means 3404. In step 3704, the intra-raster judging means 3404 judges whether data is included within the current raster from the start-point information of slant vector data. If data is included within the current raster, the intra-raster judging means 3404 supplies the data to the second temporarily-storing/arranging means 3406. If data is not included, the intra-raster judging means 3404 supplies the data to the first temporarily-storing/arranging means 3405. In step 3705, the output-data generating means 3402 generates and supplies output data.

By using the hardware structure mentioned above, it is possible to orderly determine and decompose output data without disturbing the arrangement order.

Figure 38:
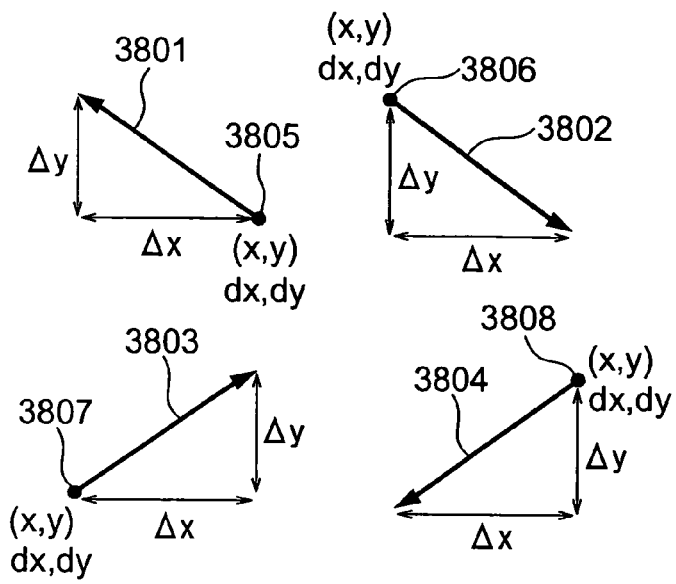
FIG. 38 is a diagram showing a method of defining the slant vector data in the embodiments of the invention.

The type of slant will be next mentioned. As shown in FIG. 38, there are ascending-left slant segment 3801, a descending-right slant segment 3802, ascending-right slant segment 3803 and descending-left slant segment 3804. The slant segments 3801 and 3802 are equal, but only different in start-point. Either one may be used. If slant segments of each raster are to be processed at a time, it is desired to produce data in the order of raster number (increasing in Y-direction). In other words, the slant segments increasing in Y-direction are desirable. If data were allowed to include the segments decreasing in Y-direction and to decrease as the processing goes beyond rasters, data of each raster could not be processed in the raster scanning order. This is because data is decided to be present at the places of start-points when data is inputted, while data of a processed raster arises when slant segments are decomposed. Therefore, the possible data to be defined suitable for the above slant decomposition are the ascending-left slant and ascending-right slant.

Figure 39:
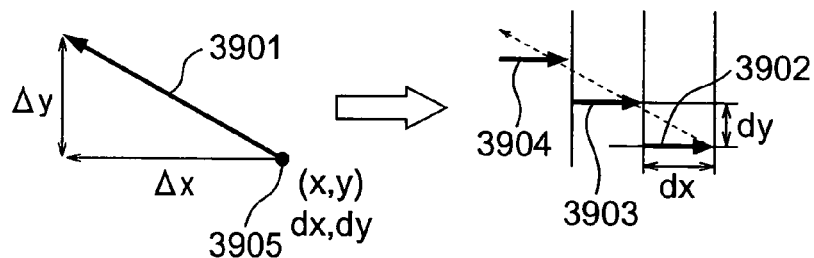
FIG. 39 is a diagram showing an example of the data-arrangement order disturbed in the slant decomposing means in the embodiments of the invention.
Figure 40:
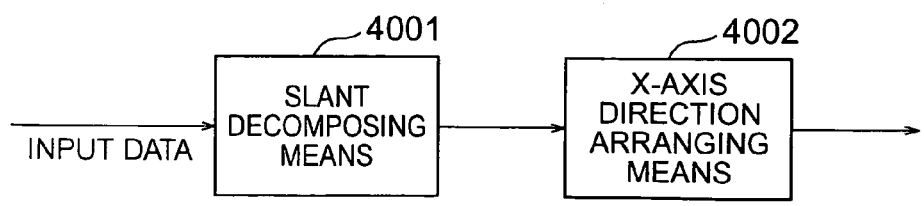
FIG. 40 is a diagram showing an example of arranging means added to prevent the data arrangement order from being disturbed in the slant decomposing means in the embodiments of the invention.

A specific example will be described of the case of using slant segments represented by the ascending-left slant 3801 and ascending-right slant 3803. When decomposition is made of an ascending-right slant segment that is formed of start-point (x, y), length ($\Delta x$, $\Delta y$) and decomposition parameters (dx, dy), the cut-away data has start point (x, y)=(x, y) and length dx. The remaining data left after the decomposition has start-point (x+dx, y+dy), length ($\Delta x$−dx, $\Delta y$−dy) and decomposition parameters (dx, dy). If the ascending-left slant segment is decomposed, the cut-away data has start-point (x, y)=(x−dx, y) and length dx. The data left after the decomposition has start-point (x−dx, y+dy), length ($\Delta x$−dx, $\Delta y$−dy) and decomposition parameters (dx, dy). At this time, if the above-mentioned slant-decomposing means processes the ascending-left slant segment, the arrangement condition is disturbed. If the ascending-left slant segment 3901 is decomposed according to the procedure that the above-mentioned slant-decomposing means takes, it produces output data of segments 3902, 3903 and 3904 in this order as shown in FIG. 39. In order to correct, or rearrange the disturbed order, an X-axis arranging unit 4002 is connected in series to the slant-decomposing means 4001 as shown in FIG. 40.

However, the arranging means 4002 will not be required if the data that needs to be arranged is developed into segments parallel in the X-axis direction or if the ascending-right slant that does not go beyond raster is defined and decomposed when preprocessing is made by a computer or the like.

Figure 41:
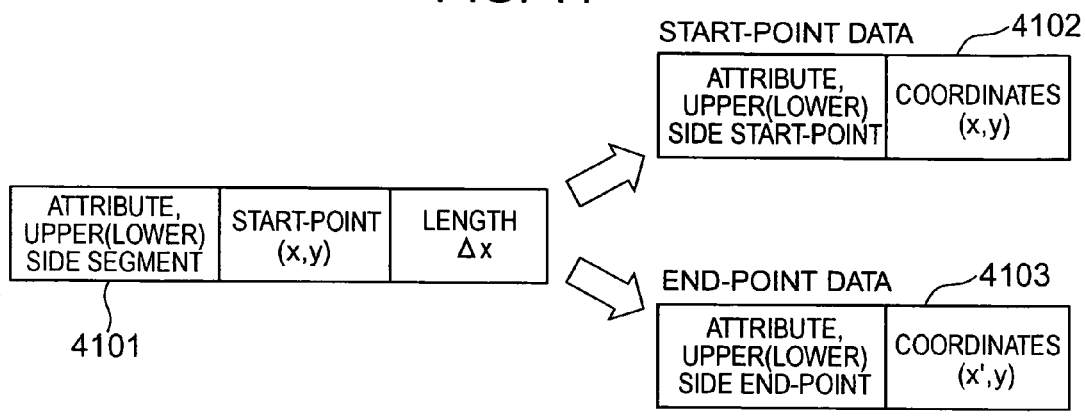
FIG. 41 is a diagram showing an example of the ends-separating operation by using the data structure in the embodiments of the invention.

The ends separating means will be next described. The ends-separating means is composed of ends-producing means and ends-arranging means. The ends-producing means decomposes a group of horizontal segment vectors into ends (start-points, and end-points), and adds attributes to the ends as (upper side start-points, upper side end-points, lower side start-points and lower side end-points). FIG. 41 shows the data structure. The segment vector data formed of attributes, start-points (x, y) and length $\Delta x$ is decomposed into start-point data formed of attribute and start-point (x, y) and end-point data formed of attribute and end-point (x', y')=(x+$\Delta x$, y).

Figure 42:
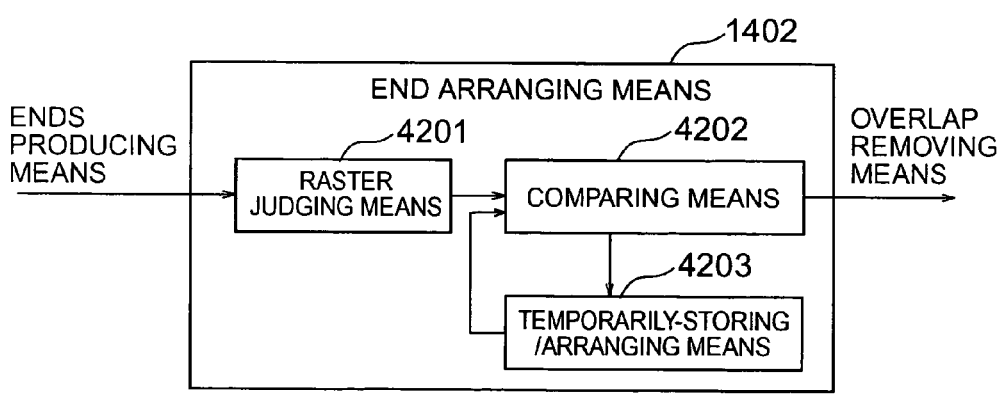
FIG. 42 is a diagram showing the structure of the arranging means in the embodiments of the invention.

FIG. 42 shows the construction of the arranging means. The arranging means 1402 is comprised of raster judging means 4201, comparing means 4202, and temporarily-storing/arranging means 4203. The raster judging means 4201 judges whether input data has gone beyond the current raster. The comparing means 4202 compares input end data with output end data from the temporarily-storing/arranging means 4203. The temporarily-storing/arranging means 4203 temporarily stores the end data not selected by the comparing means 4202, and arranges the data.

The operation of the arranging means will be mentioned next. The comparing means 4202 compares the output data from the temporarily-storing/arranging means 4203 and the next input data and selects the output data to be produced. The remaining data not selected yet is once stored in the temporarily-storing/arranging means 4203, and is read out in the order of smaller X-coordinate. The raster judging means 4201 judges whether the current raster of data that is being processed has changed. At the instant when the current raster is changed to another raster, the temporarily-storing/arranging means 4203 already completely reads out all the stored data. Then, the arranging means starts to process the data of the next raster.

The overlap removing means will be described. The overlap removing means judges the overlap of figures while it is counting the number of upper (or lower) side start-points and upper (or lower) side end-points. Then, it removes unnecessary ends and generates new ends according to the results. It is assumed that the input data is already arranged in the raster scanning direction.

Figure 43:
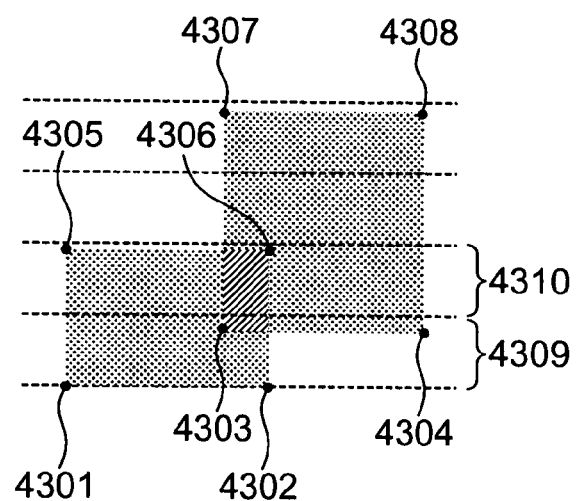
FIG. 43 is a diagram showing an example of the depicted pattern in the embodiments of the invention.
Figure 44:
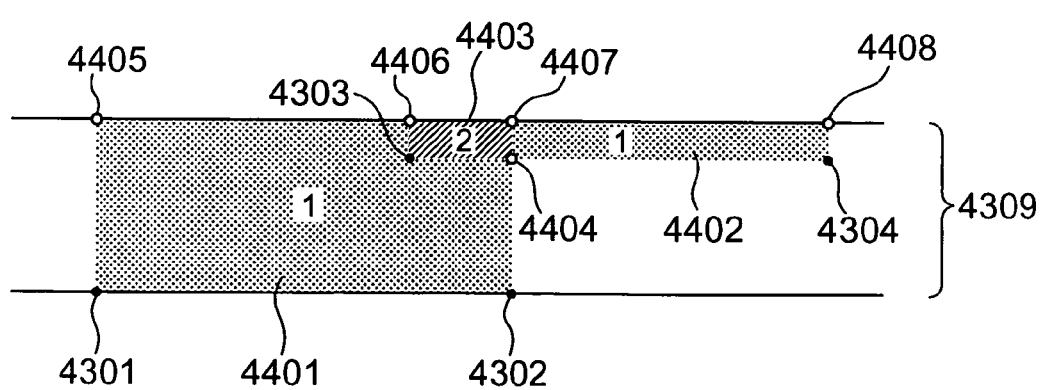
FIG. 44 is a diagram showing an example of the operation of the overlap removing means that processes each raster unit at a time in the embodiments of the invention.
Figure 45:
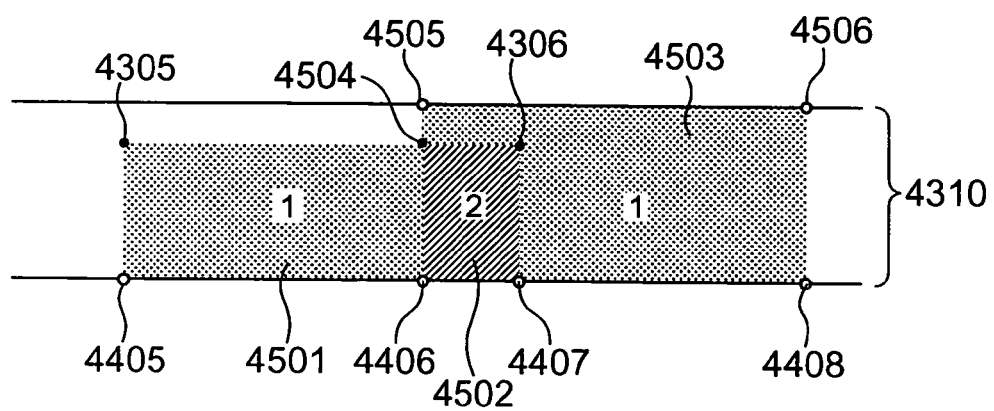
FIG. 45 is a diagram showing another example of the operation of the overlap removing means that processes each raster unit at a time in the embodiments of the invention.

The operation will be described in detail with reference to a pattern of figures shown in FIG. 43. FIG. 44 is a magnified view of the first raster 4309. Since the ends are supplied in the raster scanning order, the ends of 4301, 4303, 4302 and 4304 are inputted in this order. When the end-point 4302 is inputted, the overlap removing means judges that the area 4401 has overlap number 1. When the end-point 4304 is inputted, two pairs of start-point and end-point are determined, and the number of overlaps of these areas is judged by processing. The overlap removing means judges that there is not any need to remove any overlap because the boundary between overlap numbers 0 and 1 indicates a figure with no overlap. As a result, it produces the start-point 4301 and end-point 4302. Since the start-point 4303 is the boundary between the overlap numbers 1 and 2, it is removed, and an end-point 4404 is generated. Then, a pair of start-point 4404 and end-point 4304 is generated, and the processing for first raster 4309 is finished. In addition, it adds overlap number information to the end data 4405, 4406, 4407 and 4408 of a figure continuous to the next raster, and holds it until the next raster. The processing for the second raster 4310 treats the held data 4405, 4406, 4407 and 4408 as the lower-limit end data similar to the lower side end data of figure as shown in FIG. 45. At the time of processing the second raster, as the first raster is treated, the overlap removing unit judges the overlap number when the overlap area is determined, removes the end-point 4306, and creates an end-point 4504. In addition, it holds the end-points 4505, 4506 of a figure continuous to the next raster. The same processing is made in the raster scanning direction, and the ends representing figures with no overlap are produced in the order of raster scanning, or smaller X-coordinate.

The bitmapped data generating means receives end data of figures with no overlap, adds the areas of pixels over the region from the start-end, and subtracts the areas of pixels over the region from the end-point.

Figure 46:
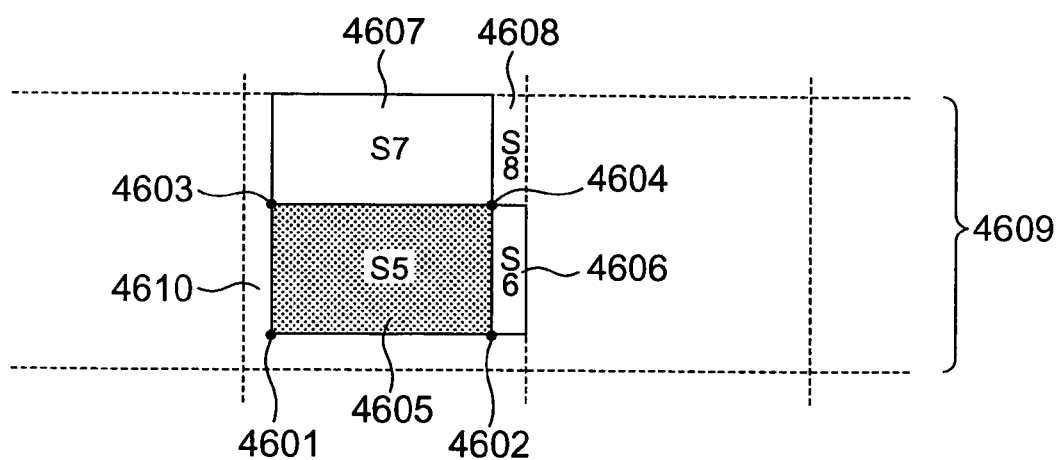
FIG. 46 is a diagram showing an example of the operation of the bitmap developing means that processes each raster unit at a time in the embodiments of the invention.

A specific computing method used when the pixel 4610 within the raster 4609 is processed will be described with reference to FIG. 46. We consider that the end data is inputted in the order of lower side start-point 4601, upper side start-point 4603, lower side end-point 4602 and upper side end-point 4604.

The bitmapped-data generating means, when receives the lower side start-point 4601, computes the area (S5+S6+S7+S8) of the upper right region (regions 4605, 4606, 4607 and 4608) within the pixel 4610. When receiving the next upper side start-point 4603, it subtracts the area (S7+S8) of the upper right region (regions 4607 and 4608) from the result of the previous computation. When receiving the lower side end-point 4602, it subtracts the area (S6+S8) of the upper right region (regions 4606 and 4608) from the result of the previous computation. Then, when receiving the upper side end-point 4604, it adds the area (S8) of the upper right region (region 4608) to the result of the previous computation. As a result, the desired area of the figure can be found from the expression of (S5+S6+S7+S8)−(S7+S8)+(S8)=S5. For the figure that goes beyond the current raster, as the above overlap removing unit processed, the end data is held as the lower-limit end data until the processing for the next raster, and the same processing as for the lower side end is performed when the next raster is processed.

If the above operation is performed in the raster scanning order by means of pipeline processing, bitmapped data can be sequentially produced. In the above processing, the processing time of each means changes depending upon the content of the pattern to be processed. If the pre-stage process takes a long processing time, the post-stage process must wait for the pre-stage process to complete the processing. Thus, a buffer memory that holds the data is inserted between the means, thereby averaging the overall processing time. Since each means sequentially produces data in the raster scanning order, the buffer memory may be a small-scale device capable of holding data of only several rasters.

In addition, if a plurality of the above full constructions is provided so that the data to be processed can be partitioned and assigned to those constructions by the data-processing computer, the speed of the processing for data can be increased by parallelizing.

Second Embodiment

An embodiment will be given in which software is used for the processing in the above vector-data developing means and the following means. It can be achieved by parallelizing the operation of the computer such as WS.

Figure 47:
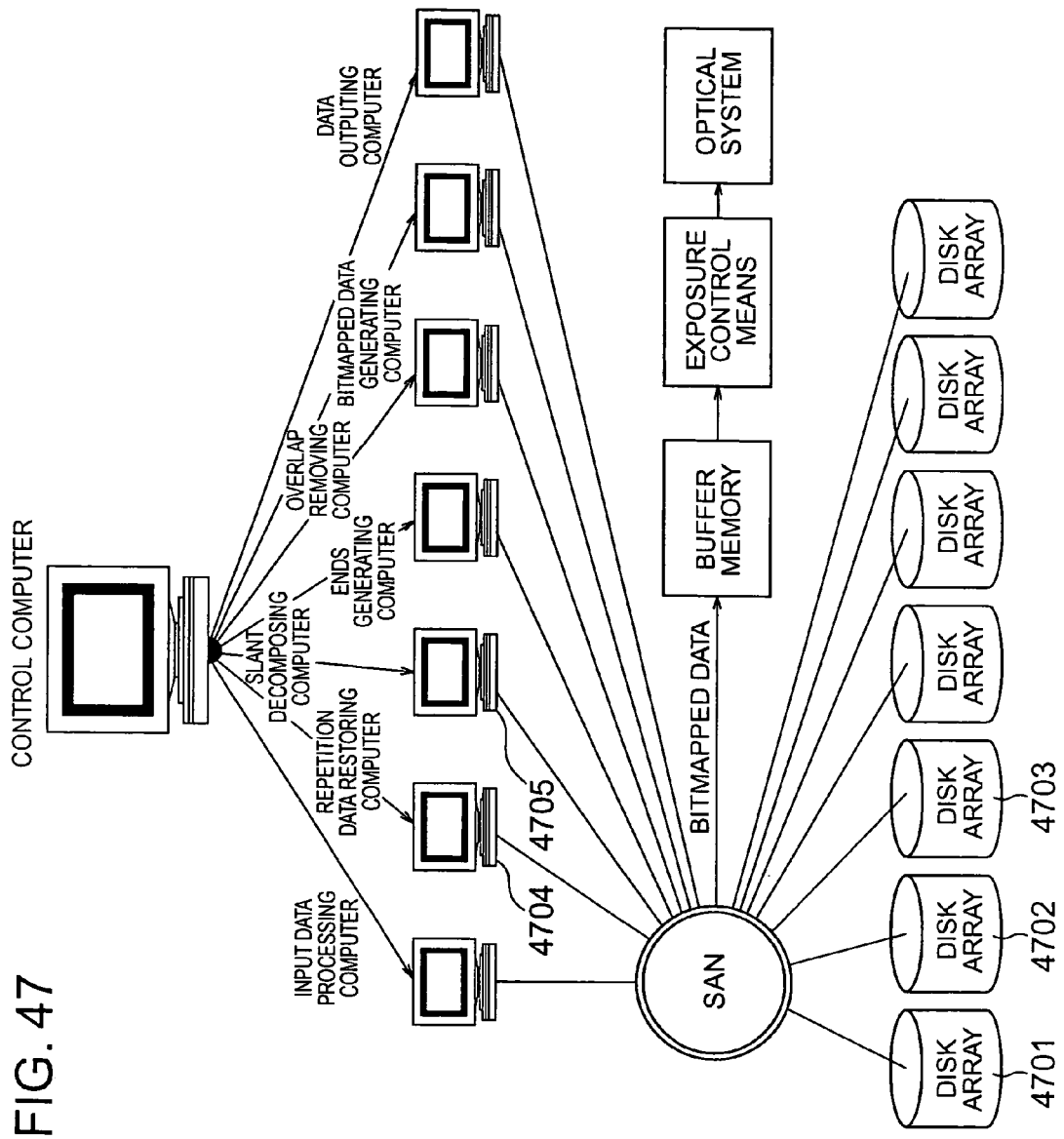
FIG. 47 is a diagram showing an example of the case in which this invention is actualized by using software in the embodiments of the invention.

For example, a system having SAN (Storage Area Network) structure shown in FIG. 47 can be considered as the parallelized construction for making the above parallel processing. The operations of the previously given processing means are performed by computers. In addition, a disk array for each processing step is provided to store input data and processed data. In this case, the disk regions to be used may be set up in order that data through separate routes or from separate systems can be independently similarly read and written in those regions with high speed. For example, a computer 4704 for restoring repetition-compressed data reads and takes in data from a disk array 4701, and supplies the processed data to a disk array 4702 where it is stored. A computer 4705 for slant decomposition reads and takes in data from a disk array 4702, and supplies the processed data to a disk array 4703 where it is stored. Thus, if the units of data to be processed are optimized in this way, the pipeline processing can be performed for each unit. Moreover, if a plurality of the systems one of which is shown in FIG. 47 is provided to process the divided portions of data being processed, the data can be much faster processed.

Since the transmission of data between CPU and external storage devices takes a long time in the case of using software for processing, a certain amount of data may be stored in a high-speed memory, and arithmetically processed by the communication between the CPU and the high-speed memory. Thus, since the communications between the CPU and other peripheral circuits can be reduced as much as possible, data can be fast processed. Therefore, it is desirable that data be divided so that each amount of partitioned data stored in the high-speed memory can be just completely processed. In addition, in order that the above processing can be made by means of pipeline processing, it is desired to determine a certain unit amount of the output data in each processing means.

Since the repetition-compressed data restoring processing, slant-decomposing processing and ends-separation processing can be performed by using only the information added to data, there is no need to allow for the data arranging process. The content of the computation is the same as in the embodiment 1, and thus will not be described in detail.

Since the overlap removing process and bitmap development process must be performed by the communications between a plurality of pieces of data, the communications between CPU and external storage devices are required if the necessary data is not held in the high-speed memory, thus taking a long time for the processing. In addition, first, segmentation information for data is needed to insert in order to judge whether data is continued after certain data. In order to avoid these needs, it is desired that the data to be inputted to the overlap removing means be already arranged in a form of units fitted to store in the high-speed memory.

Since it is difficult to construct a large-scale arranging means by hardware, each processing means makes the arranging process, thus reducing the scale of the arranging circuits. However, since large-scale arranging means can be built up by software, each processing means (computer) may be used to make the arranging processing after other necessary processing as in the embodiment 1 or a computer for arranging process may be provided before the overlap removing computer in order to increase the efficiency. Any construction may be used as long as the data to the overlap removing means meets the above condition.

For example, it is assumed that data of one raster satisfies the above condition. In order that the overlap-removing computer is able to perform the pipeline processing with the above condition satisfied, the repetition-compressed data restoring computer, slant-decomposing computer and ends-separating computer supply data of one-raster units at a time to the disk arrays.

The overlap existing within the raster is removed from the end data by the method of removing an overlap according to the overlap number as in the embodiment 1. The end data thus processed is supplied, and the data for processing the next raster is held. This idea is the same as above and thus will not be described in detail. For the bitmapped-data generating means, too, bitmapped data of one raster is generated according to the above area-rate algorithm. The idea is the same as above and thus will not be described in detail. The produced data of each raster unit is read out at a time, and supplied to the exposure controller. In this case, the overlap removing means and bitmapped data generating means need a high-speed memory (working area) of the capacity to completely process the amount of one-raster data. Even if the capacity (working area) of the high-speed memory is too large to be physically constructed, it can be reduced by, before the overlap removing process, arranging the intra-raster data in the raster scanning direction (X-direction) and further dividing the raster into smaller units of processing in the X-direction. In this case, however, the data for the next raster is held in a separate place until the data of one raster is completely processed. Thus, data is divided to be smaller enough to process within the high-speed memory, and processed according to the pipeline processing.

In addition, the end data is arranged in the raster scanning direction (X-direction) before being supplied, and a buffer memory 4801 for memory capacity is provided to allow for the processing speed as illustrated in FIG. 48. Thus, the overlap removing means 4802 and the following means can be built up by the hardware of embodiment 1. Moreover, only the bitmap developing portion 4803 may be constructed by hardware. In these cases, since the processing using software is generally slower than that using hardware, the waiting time in hardware can be eliminated by providing parallelized software means for single-system hardware, so that high-speed pipeline processing can be performed.

The bitmapped data generated in certain units of processing from the above construction is sequentially read and fed to the exposure controller and exposure system, where drawing is performed.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam drawing apparatus for drawing an integrated circuit pattern on a semiconductor sample, comprising:

segment vector developing means that converts designed data of a polygon expressed in vectors to converted segment vector data, and said converted segment vector data contains attribute data which indicates on what sides segments of said converted segment vector data are located and segment data which indicates a start-point and end-point, wherein said designed data serves as a basis to draw said integrated circuit pattern on said semiconductor sample;

ends separating means that separates two end data of the start-point and end-point from the segment data of said converted segment vector data;

bitmapped data generating means that generates multi-valued bitmapped data except for two-valued bitmapped data, by calculating from said end data, without generating the two-valued bitmapped data;

exposure control means that controls a charged particle beam according to said multi-valued bitmapped data; and an optical system that irradiates said charged particle beam to expose said semiconductor sample by a raster scanning of said charged particle beam while said beam is being controlled by said exposure control means;

wherein segments perpendicular to the raster scanning direction are omitted in said converted segment vector data.

2. A charged particle beam drawing apparatus according to claim 1, wherein each of said segment vector data developing means, said ends separating means and said bitmapped data generating means processes unit data of each of rasters at a time that are sequentially repeated to scan for said exposure irradiation.

3. A charged particle beam drawing apparatus according to claim 2, wherein said designed data includes a pattern shape for a semiconductor device or other purposes, said raster scanning is made in an X-axis direction, said rasters are repeated in a Y-axis direction, said segment vector developing means sequentially reads raster units of said designed data in the Y-axis direction, and said designed data to be read is also arranged in the raster scanning direction, or the X-axis direction.

4. A charged particle beam drawing apparatus according to claim 2, wherein said segment vector developing means has repetition-compressed data restoring means that restores repetition-compressed segment data to segment data.

5. A charged particle beam drawing apparatus according to claim 4, wherein said repetition-compressed data restoring means includes:

output-data generating means that processes said repetition-compressed data in the order of smaller raster-scanning direction (X-axis) coordinate;

remaining-data processing means that redefines the remaining repetition-compressed vector data except output data as repletion-compressed vector data;

temporarily-storing/arranging means that arranges said redefined repetition-compressed vector data in the order of said smaller X-axis coordinate, and stores said arranged vector data; and comparing means that compares said X-axis coordinate data of said repetition-compressed vector data produced from said temporarily-storing/arranging means with said X-axis coordinate data of the next input data, and supplies the resulting smaller one to said output-data generating means and the other data to the remaining-data processing means.

6. A charged particle beam drawing apparatus according to claim 4, wherein said converted segment vector data as input data to said repetition-compressed data restoring means is composed of attribute data representing the type of segment, segment data formed of the start-point and end-point or the start-point and length, and repetition information data for use in the restoration processing, and said converted segment vector data has a data structure capable of expressing a plurality of pieces of data by rewriting the produced segment data while referring to said repetition information data and said segment data.

7. A charged particle beam drawing apparatus according to claim 3, wherein said segment vector developing means has slant decomposing means that develops slant vector data into segment data approximately of a plurality of segments parallel in said raster scanning (X-axis) direction.

8. A charged particle beam drawing apparatus according to claim 7, wherein said slant decomposing means is constructed to have:

output-data generating means that processes said segment data in the order of smaller raster scanning direction (X-axis) coordinate;

remaining-data generating means that redefines the remaining slant-vector data as slant vector data;

intra-raster judging means that judges whether said redefined slant vector data is included within the current raster;

first temporarily-storing/arranging means that arranges intra-raster data judged to include within said current raster in the order of smaller X-axis coordinate, and stores said arranged data;

second temporarily-storing/arranging means that arranges extra-raster data judged not to include within said current raster in the order of smaller X-axis coordinate, and stores said arranged data; and comparing means that compares input data, output data from said first temporarily-storing/arranging means, and output data from said second temporarily-storing/arranging means to select data of smaller raster number (Y-axis direction) and smaller raster scanning direction (X-axis) coordinate, and supplies said selected data to said output-data generating means and to said remaining slant data generating means.

9. A charged particle beam drawing apparatus according to claim 7, wherein said slant decomposing means has arranging means constructed to arrange so that the slant-decomposed data produced from slant vector data by said output-data generating means that processes data in the order of smaller X-axis coordinate can be produced in the order of said smaller X-axis coordinate.

10. A charged particle beam drawing apparatus according to claim 7, wherein said slant decomposing means receives input data formed of attribute data indicating type of segment vector, segment data formed of the start-point and end-point of segment vector and decomposition information data for decomposition processing, and produces output data of a data structure capable of expressing a plurality of slant decomposed data by rewriting segment data while referring to said decomposition information data.

11. A charged particle beam drawing apparatus according to claim 2, wherein said ends separating means has:

end producing means that decomposes said converted segment vector data formed of the start-point and length and parallel in the raster scanning direction (X-axis direction) into end data of two start-point and end-point; and arranging means that arranges said separated end data in the order of said smaller X-axis direction.

12. A charged particle beam drawing apparatus according to claim 3, wherein said segment-vector developing means has repetition-compressed data restoring means that restores repetition-compressed data to segment data.

13. A charged particle beam drawing apparatus according to claim 12, wherein said repetition-compressed data restoring means includes:

output-data generating means that processes said repetition-compressed data in the order of small X-axis coordinate;

remaining-data processing means that redefines the remaining repetition-compressed vector data except said produced output data as repetition-compressed vector data;

temporarily-storing/arranging means that arranges said redefined repetition-compressed vector data in the order of said smaller X-axis coordinate, and stores said arranged data; and comparing means that compares X-axis coordinate data of said repetition-compressed vector data produced from said temporarily-storing/arranging means with that of the next input data to selectively supply the resulting smaller one to said output-data generating means and the remaining one to said remaining-data processing means.

14. A charged particle beam drawing apparatus according to claim 12, wherein said repetition-compressed data restoring means receives said converted segment vector data as input data formed of attribute data indicating type of segment vector, segment data formed of the start-point and end-point or the start-point and length and repetition information data for decomposition processing, and produces output data of a data structure capable of expressing a plurality of pieces of data by rewriting produced segment data while referring to said repetitive information data and segment data.

15. A charge particle beam drawing apparatus for drawing an integrated circuit pattern on a semiconductor sample, comprising:

segment vector developing means that converts designed data of a polygon expressed in vectors to converted segment vector data, and said converted segment vector data contains attribute data which indicates on what sides segments of said converted segment vector data are located and segment data which indicates a start-point and end-point, wherein said designed data is used as a basis to draw said integrated circuit pattern on said semiconductor sample;

ends separating means that separates two end data of the start-point and end-point from the segment data of said converted segment vector data;

bitmapped data generating means that generates multi-valued bitmapped data greater than two-valued bitmapped data, by calculating from said end data, without generating the two-valued bitmapped data;

exposure control means that controls a charged particle beam according to said multi-valued bitmapped data; and an optical system that irradiates said charged particle beam to expose said semiconductor sample by a raster scanning of said charged particle beam while said beam is being controlled by said exposure control means;

wherein segments perpendicular to the raster scanning direction are omitted in said converted segment vector data.

16. A charged particle beam drawing apparatus according to claim 15, wherein each of said segment vector data developing means, said ends separating means and said bitmapped data generating means processes unit data of each of rasters at a time that are sequentially repeated to scan for said exposure irradiation.

17. A charged particle beam drawing apparatus according to claim 16, wherein said designed data includes a pattern shape for a semiconductor device or other purposes, said raster scanning is made in an X-axis direction, said rasters are repeated in a Y-axis direction, said segment vector developing means sequentially reads raster units of said designed data in the Y-axis direction, and said designed data to be read is also arranged in the raster scanning direction, or the X-axis direction.

18. A charged particle beam drawing apparatus according to claim 17, wherein said segment-vector developing means has repetition-compressed data restoring means that restores repetition-compressed data to segment data.

19. A charged particle beam drawing apparatus according to claim 18, wherein said repetition-compressed data restoring means includes:

output-data generating means that processes said repetition-compressed data in the order of small X-axis coordinate;

remaining-data processing means that redefines the remaining repetition-compressed vector data except said produced output data as repetition-compressed vector data;

temporarily-storing/arranging means that arranges said redefined repetition-compressed vector data in the order of said smaller X-axis coordinate, and stores said arranged data; and comparing means that compares X-axis coordinate data of said repetition-compressed vector data produced from said temporarily-storing/arranging means with that of the next input data to selectively supply the resulting smaller one to said output-data generating means and the remaining one to said remaining-data processing means.

20. A charged particle beam drawing apparatus according to claim 18, wherein said repetition-compressed data restoring means receives said converted segment vector data as input data formed of attribute data indicating type of segment vector, segment data formed of the start-point and end-point or the start-point and length and repetition information data for decomposition processing, and produces output data of a data structure capable of expressing a plurality of pieces of data by rewriting produced segment data while referring to said repetitive information data and segment data.

21. A charged particle beam drawing apparatus for drawing an integrated circuit pattern on a semiconductor sample, comprising:

segment vector developing means that converts designed data of a polygon expressed in vectors to converted segment vector data, and said converted segment vector data contains attribute data which indicates on what sides segments of said converted segment vector data are located and segment data which indicates a start-point and end-point, wherein said designed data serves as a basis to draw said integrated circuit pattern on said semiconductor sample;

ends separating means that separates two end data of the start-point and end-point from the segment data of said converted segment vector data;

bitmapped data generating means that generates multi-valued bitmapped data except for two-valued bitmapped data, by calculating an area rate from said end data, without generating the two-valued bitmapped data;

exposure control means that controls a charged particle beam according to said multi-valued bitmapped data; and an optical system that irradiates said charged particle beam to expose said semiconductor sample by a raster scanning of said charged particle beam while said beam is being controlled by said exposure control means;

wherein segments perpendicular to the raster scanning direction are omitted in said converted segment vector data.

* * * * *